(12) United States Patent
Kameshiro et al.

(10) Patent No.: US 7,859,889 B2
(45) Date of Patent: Dec. 28, 2010

(54) SEMICONDUCTOR MEMORY DEVICE

(75) Inventors: Norifumi Kameshiro, Kokubunji (JP);
Riichiro Takemura, Tokyo (JP);
Tomoyuki Ishii, Kokubunji (JP)

(73) Assignee: Renesas Electronics Corporation,
Kawasaki-shi (JP)

( * ) Notice: Subject to any disclaimer, the term of this patent is extended or adjusted under 35 U.S.C. 154(b) by 92 days.

(21) Appl. No.: 12/186,204

(22) Filed: Aug. 5, 2008

(65) Prior Publication Data

US 2008/0285325 A1 Nov. 20, 2008

Related U.S. Application Data

(63) Continuation of application No. 11/399,397, filed on Apr. 7, 2006, now Pat. No. 7,468,901.

(30) Foreign Application Priority Data

Apr. 8, 2005 (JP) .............................. 2005-112495

(51) Int. Cl.
*G11C 11/24* (2006.01)

(52) U.S. Cl. ................... 365/149; 365/230.05
(58) Field of Classification Search ................ 365/149, 365/230.05, 296
See application file for complete search history.

(56) References Cited

U.S. PATENT DOCUMENTS

| 5,220,530 | A | 6/1993 | Itoh |
| 5,757,693 | A | 5/1998 | Houghton et al. |
| 5,835,403 | A | 11/1998 | Forbes |
| 6,314,017 | B1 * | 11/2001 | Emori et al. ................. 365/149 |
| 6,362,502 | B1 | 3/2002 | Rosner et al. |
| 6,677,633 | B2 | 1/2004 | Sakata et al. |
| 7,009,243 | B2 * | 3/2006 | Ishii et al. .................... 257/315 |
| 2002/0075723 | A1 | 6/2002 | Hofmann et al. |
| 2003/0123313 | A1 * | 7/2003 | Hanzawa et al. ............ 365/210 |
| 2006/0054977 | A1 | 3/2006 | Somasekhar et al. |

FOREIGN PATENT DOCUMENTS

JP 2001-53167 2/2001

* cited by examiner

*Primary Examiner*—Vu A Le
(74) *Attorney, Agent, or Firm*—Miles & Stockbridge P.C.

(57) ABSTRACT

In a two-transistor gain cell structure, a semiconductor memory device capable of stable reading without malfunction and having small-area memory cells is provided. In a two-transistor gain cell memory having a write transistor and a read transistor, a write word line, a read word line, a write bit line, and a read bit line are separately provided, and voltages to be applied are independently set. Furthermore, a memory cell is connected to the same read word line and write bit line as those of an adjacent memory cell.

6 Claims, 29 Drawing Sheets

MC  RWL  WWL  WBL  RBL

US 7,859,889 B2

SEMICONDUCTOR MEMORY DEVICE

CROSS-REFERENCE TO RELATED APPLICATION

This application is a continuation of application Ser. No. 11/399,397 filed Apr. 7, 2006 now U.S. Pat. No. 7,468,901. This application also claims priority from Japanese Patent Application No. JP 2005-112495 filed on Apr. 8, 2005, the content of which is hereby incorporated by reference into this application.

TECHNICAL FIELD OF THE INVENTION

The present invention relates to a semiconductor memory device. More particularly, it relates to a technology effectively applied to a memory having a two-transistor gain cell structure.

BACKGROUND OF THE INVENTION

For example, technologies regarding semiconductor memory devices studied by the inventors include the following technologies.

In a one-transistor one-capacitor DRAM (Dynamic Random Access Memory) typical as a high-density large-capacity semiconductor memory, as shown in FIG. 29A, a transistor M which is turned ON/OFF by the potential of a word line WL and a memory capacitor C are connected in series between a bit line BL and a common potential line (for example, ground potential GND) to form a memory cell. In this memory cell, information is stored by accumulating different amounts of charge into the capacitor C depending on the setting of the potential of the bit line BL in a write operation. In a read operation, the bit line is directly charged and discharged by a signal charge retained in the capacitor C and changes in potential of the bit line are amplified by a sense amplifier, thereby determining whether the storage information indicates "1" or "0". Therefore, in order to ensure a stable operation at the time of reading the storage information, it is necessary to provide a sufficient capacitance.

However, along with the development of microfabrication of memory cells, the area that can be used for the capacitor is decreased. Therefore, by the further microfabrication of memory cells, an accumulated amount of charge is decreased, and the amplitude of a read signal is reduced. As a result, it becomes impossible to ensure the stable operation at the time of reading. For its prevention, generation after generation, technologies to ensure a certain amount of signal charge such as making the capacitor C more spatial and increasing a dielectric constant of a capacitor insulating film have been developed. However, a novel high dielectric constant material has to be developed for each generation, and the scaling has become more and more difficult.

To solve the problem above, as shown in FIG. 29B, a so-called gain cell has attracted attention, in which a signal charge is retained at the gate electrode of a read transistor M1 and the signal is amplified by the read transistor M1 and then outputted to the bit line BL at the time of reading (for example, FIG. 16 of Japanese Patent Application Laid-Open Publication No. 2001-53167 (Patent Document 1)). Such a gain-cell structure can ensure a sufficient read signal even with a small amount of accumulated charge, and thus, the gain-cell structure is suitable for microfabrication.

FIG. 29B is a circuit diagram depicting a structure example of a two-transistor one-capacitor memory cell, which is one type of gain cell. As shown in FIG. 29B, the memory cell is formed of a write transistor M2, a read transistor M1, and a capacitor C. The write transistor M2 has a gate connected to a word line WL, and one of a source and drain thereof is connected to a bit line BL. The read transistor M1 has a gate connected to the other of the source and drain of the write transistor M2, a source connected to the bit line BL, and a drain connected to a supply line of a reference potential (for example, a ground potential GND). One electrode of the capacitor C is connected to a midpoint of the connection between the read transistor M1 and the write transistor M2, and the other electrode thereof is connected to the word line WL. The one electrode of the capacitor C and the midpoint of the connection between the read transistor M1 and the write transistor M2 connected thereto form a storage node SN of the memory cell.

In another method, a word line is divided into a line for writing and a line for reading, and a read operation is performed while independently controlling the divided word lines. For example, FIG. 2 and the description of Patent Document 1 disclose a technology for a two-transistor one-capacitor DRAM gain cell having a word line for writing and a word line for reading. In a memory cell having such a gain-cell structure, as shown in FIG. 29C, a word line for writing (write word line WWL) and a word line for reading (read word line RWL) are separately provided.

SUMMARY OF THE INVENTION

Incidentally, as a result of the studies for the technologies described above by the inventors of the present invention, the following has become apparent.

For example, in the memory cell as shown in FIG. 29B, one word line is used for both writing and reading. Therefore, it is impossible to separately control the read transistor M1 and the write transistor M2. Consequently, there is a problem of low flexibility in setting a voltage to be applied to the word line. This problem will be described below in detail.

In the memory cell as shown in FIG. 29B, the word line WL requires at least three levels of potential setting at the time of writing. More specifically, the following three levels are required as set potentials for the word line WL, that is: a holding voltage that always holds the write transistor M2 and the read transistor M1 in an OFF state; a high voltage at the time of reading that always holds the p type write transistor M2 in an OFF state and turns ON/OFF the n type read transistor M1 in accordance with storage information at the time of a read operation; and a low voltage at the time of writing that always turns OFF the n type read transistor M1 and turns ON the p type write transistor M2 irrespectively of the storage information at the time of a write operation.

Also, ON/OFF of the read transistor is controlled in accordance with the storage information and the voltage coupling between the word line WL and the capacitor C. Therefore, if just a parasitic capacitance is not enough, an additional step of forming a capacitor at the storage node is required.

As described above, in the memory cell having the gain-cell structure shown in FIG. 29B, at least three levels of potential of the word line WL are required. Also, in consideration of the capacitance of the capacitor C and variations in threshold of the write transistor M2 and the read transistor M1, an operation margin of the transistors with respect to the voltage to be applied to the word line is small, and therefore there is a high possibility that malfunction will occur.

Furthermore, in the memory cell as shown in FIG. 29C, the word line for writing and the word line for reading are separately provided. Therefore, only two levels of set potential are required for each word line. However, since ON/OFF control at the time of a read operation is performed by the capacitor C connected between the read word line RWL and the storage node SN, a relation between the capacitance and the threshold voltage of transistors has to be carefully designed. Therefore, there is still a problem that a design margin is small. Moreover, since the number of wirings that form a memory cell array is increased, there is a problem that the area of the memory cell array is increased.

The above and other objects and novel characteristics of the present invention will be apparent from the description of this specification and the accompanying drawings.

The typical ones of the inventions disclosed in this application will be briefly described as follows.

More specifically, a semiconductor memory device according to the present invention comprises a memory cell array in which memory cells each including a write transistor and a read transistor are arranged in a matrix shape, wherein a gate electrode of the write transistor is connected to a write word line, one of source and drain regions of the write transistor is connected to a write bit line, the other of the source and drain regions of the write transistor is connected to a gate electrode of the read transistor, one of source and drain regions of the read transistor is connected to a read word line, the other of the source and drain regions of the read transistor is connected to a read bit line, the one of the source and drain regions of the read transistor is connected to the same read word line as that of an adjacent memory cell, the other of the source and drain regions of the read transistor is connected to a read bit line different from a read bit line of the adjacent memory cell, the one of the source and drain regions of the write transistor is connected to the same write bit line as that of the adjacent memory cell, and the gate electrode of the write transistor is connected to a write word line different from a write word line of the adjacent memory cell.

The effects obtained by typical aspects of the present invention will be briefly described below.

(1) Stable reading without malfunction can be achieved.
(2) The memory cell array area can be reduced.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

Figure 1:
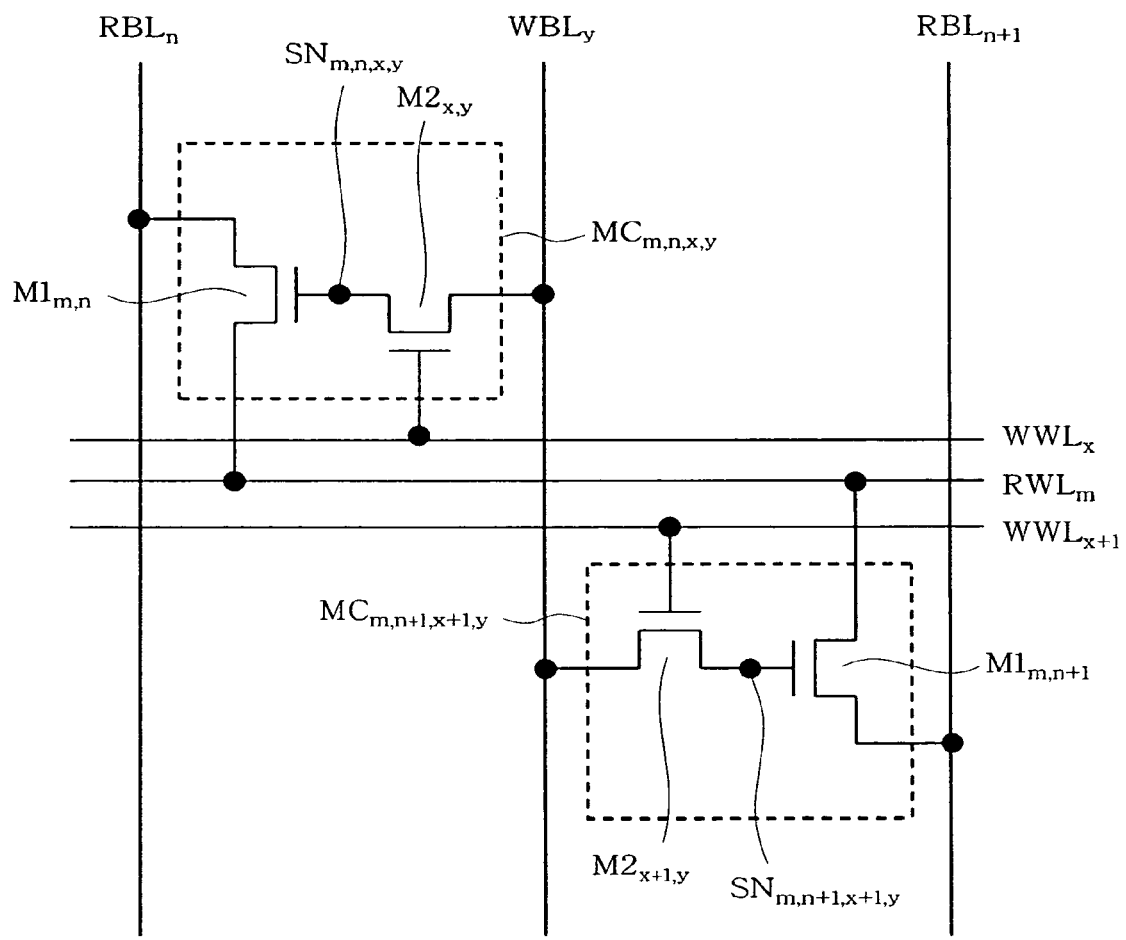
FIG. 1 is a drawing of an equivalent circuit showing a connecting relation between memory cells and wirings which form a semiconductor memory device according to a first embodiment of the present invention.

FIG. 1 is a drawing of an equivalent circuit, showing the structure and a connecting relation of a memory cell according to a first embodiment of the present invention. Note that it is assumed in the following description that wirings, memory cells, and transistors with the same suffixes (m, n, x, y: natural numbers) have a connecting relation. Also, although the case where the channel conduction type of a read transistor M1 and a write transistor M2 is n type will be described, both p type and n type can be used as the channel conduction type of the read transistor M1 and the write transistor M2. In this case, the magnitude of voltage and the direction of an electric current are changed.

First, one example of the structure of the memory cell according to the first embodiment will be described with reference to FIG. 1. A memory cell $MC_{m,n,x,y}$ according to the first embodiment includes a read transistor $M1_{m,n}$ and a write transistor $M2_{x,y}$. The write transistor $M2_{x,y}$ has a gate electrode connected to a write word line W and a drain connected to a write bit line $WBL_y$. The read transistor $M1_{m,n}$ has a gate electrode connected to a source of the write transistor $M2_{x,y}$, a source connected to a read word line $RWL_m$, and a drain connected to the read bit line $RBL_n$. In this memory cell $MC_{m,n,x,y}$, a midpoint of connection between the write transistor $M2_{x,y}$ and the read transistor $M1_{m,n}$ forms a storage node $SN_{m,n,x,y}$.

In this memory cell $MC_{m,n,x,y}$, by changing an accumulated amount of charge of the storage node $SN_{m,n,x,y}$, the potential of the gate electrode of the read transistor $M1_{m,n}$ is changed, thereby storing information. For example, the case where no charge is accumulated at the storage node $SN_{m,n,x,y}$ and the read transistor $M1_{m,n}$ is in an OFF state corresponds to storage information of "0", and the case where some charge which can turn ON the read transistor $M1_{m,n}$ is accumulated corresponds to storage information of "1".

The above-described memory cell $MC_{m,n,x,y}$ is connected to the read word line $RWL_m$ and the write bit line $WBL_y$, to which an adjacent memory cell $MC_{m,n+1,x+1,y}$ is also connected, thereby suppressing an increase in area of the memory cell due to an increase in the number of wirings. Also, the memory cell $MC_{m,n,x,y}$ is connected to the read bit line $RBL_n$ and the write word line $WWL_x$, to which the adjacent memory cell $MC_{m,n+1,x+1,y}$ is not connected, which makes it possible to perform normal read and write operations.

Figure 2:
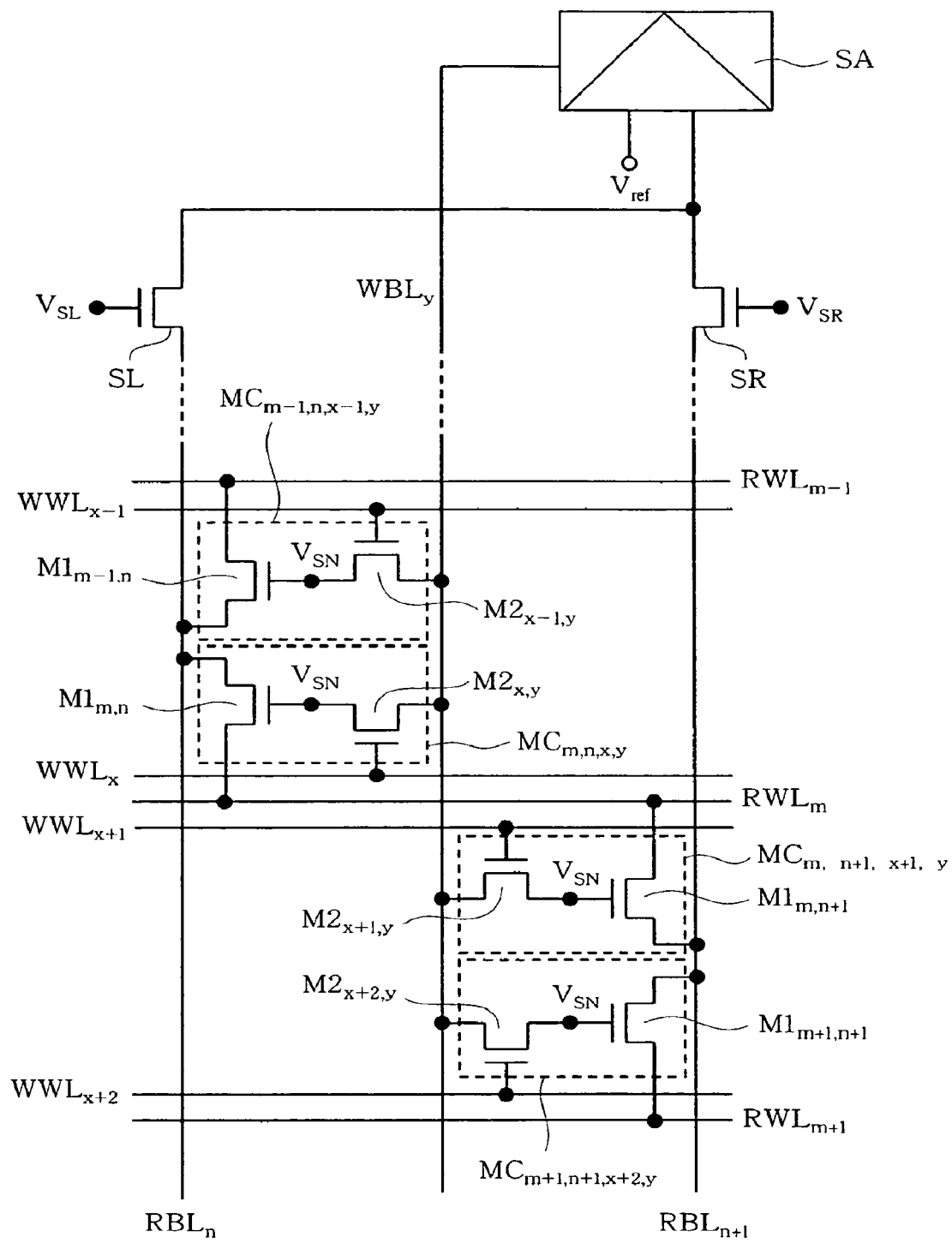
FIG. 2 is a drawing of an equivalent circuit showing a part of the semiconductor memory device according to the first embodiment of the present invention.

FIG. 2 is a drawing of an equivalent circuit showing a part of the structure of the semiconductor memory device according to the first embodiment.

As shown in FIG. 2, the above-described memory cell $MC_{m,n,x,y}$ is connected to the read bit line $RBL_n$, to which another adjacent memory cell $MC_{m-1,n,x-1,y}$ which is different from the adjacent memory cell $MC_{m,n+1,x+1,y}$ is connected. Also, the read bit line $RBL_n$ is connected via a selection transistor SL to a sense amplifier SA, a read bit line $RBL_{n+1}$ is connected via a selection transistor SR to the sense amplifier SA, and a write bit line $WBL_y$ is directly connected to the sense amplifier SA.

Figure 3:
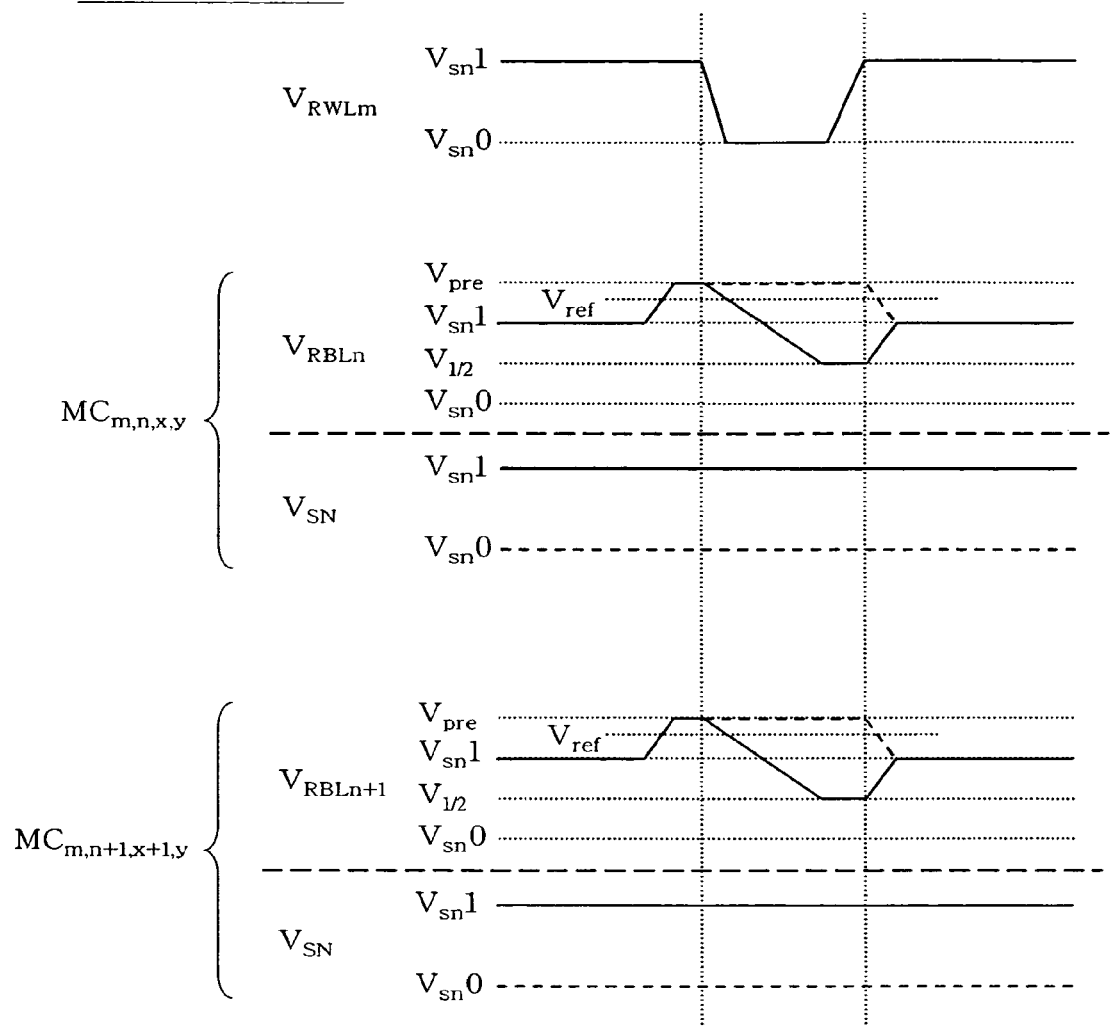
FIG. 3 is a timing chart showing signal waveforms at the time of a read operation of semiconductor memory elements in first, third, and fourth embodiments of the present invention.

FIG. 3 depicts a potential relation among wirings at the time of a read operation of the memory cell. Potentials corresponding to the storage information of "0" are represented by broken lines, and potentials corresponding to the storage information of "1" and those corresponding to the operations common to both "1" and "0" are represented by solid lines.

When the read transistor M1 is not selected, a potential $V_{RWL}$ of the read word line RWL and a potential $V_{RBL}$ of the read bit line RBL are retained at a high level. That is, these potentials are held at a value $(V_{sn}1-V_{th})$ or higher (for example, $V_{sn}1$), which is the value obtained by subtracting a threshold voltage $V_{th}$ of the read transistor M1 from a potential $V_{sn}1$ at the time when "1" is written in the storage node SN. For this reason, in both cases where the potential of the storage node SN corresponds to the storage information of "1" and where that potential corresponding to the storage information of "0", the gate electrode potential with respect to the source and drain of the read transistor M1 is equal to or lower than the threshold voltage $V_{th}$. Therefore, the read transistor M1 is in an OFF state.

That is, the following equation (1) holds.

$$0 \geq V_{sn}-V_{th}-V_{RWL}=(-V_{th}) \text{ or } (V_{sn}0-V_{th}-V_{sn}1) \quad (1)$$

At the time of reading, the read bit line RBL is precharged at a potential $V_{pre}$ which is higher than $V_{sn}1$. Then, the potential of the read word line RWL is set at a low level. That is, the potential is set at a value $(V_{sn}0-V_{th})$ or higher (for example, $V_{sn}0$), which is the value obtained by subtracting the threshold voltage $V_{th}$ of the read transistor M1 from a potential $V_{sn}0$ at the time when "0" is written in the storage node SN. By doing so, the potential of the read bit line RBL is changed in accordance with the storage information of the storage node SN. More specifically, when the storage information of the storage node SN indicates "1", a potential relation among electrodes is as represented by the following equation (2), and therefore the read transistor M1 is turned ON.

$$V_{RBL}-V_{RWL}=V_{pre}-V_{Sn}0>V_{sn}-V_{th}-V_{RWL}=V_{sn}1-V_{th}-V_{sn}0>0 \quad (2)$$

As a result, the charge precharged on the read bit line RBL is discharged to the read word line RWL, thereby decreasing the potential of the read bit line RBL.

On the other hand, when the storage information of the storage node SN indicates "0", a potential relation among the electrodes is as represented by the following equation (3), and therefore the read transistor M1 remains in an OFF state.

$$V_{RBL}-V_{RWL}=V_{pre}-V_{sn}0>0>V_{sn}0-V_{th}-V_{RWL}=V_{th} \quad (3)$$

Therefore, there is no movement of charge precharged on the read bit line RBL, and the precharged potential is retained.

The above-described read operation is performed simultaneously at the memory cells $MC_{m,n,x,y}$ and $MC_{m,n+1,x+1,y}$ which are connected to the same read word line $RWL_m$.

Note that, in the above-described read operation, the potentials of the read word line RWL and the read bit line RBL may be set at the precharge potential $V_{pre}$ from the time when it is not selected. In this case, the potential of the read bit line RBL does not have to be increased from $V_{sn}1$ to $V_{pre}$.

Since ON/OFF of the read transistor M1 forming the memory cell MC in the present embodiment is determined depending on the potential relation among the read word line RWL, the read bit line RBL, and the storage node SN, if the potential of the read bit line RBL is decreased at the time of a read operation with the storage information of "1" in the above-described read operation, this decrease will also affect the memory cell MC connected to the same read bit line RBL.

For example, it is assumed in FIG. 2 that the storage information of the read transistor $M1_{m,n}$ and the read transistor $M1_{m-1,n}$ connected to the same read bit line $RBL_n$ indicates "1". When the potential of the read word line $RWL_m$ is changed from a high level to a low level in a read operation, the read transistor $M1_{m,n}$ is turned ON, and therefore the potential of the read bit line $RBL_n$ starts to decrease from the precharge potential $V_{pre}$. At this time, when the potential of the read bit line $RBL_n$ becomes under a potential obtained by subtracting the threshold voltage $V_{th}$ from the potential $V_{sn}1$ of the gate electrode of the read transistor $M1_{m-1,n}$, the potential relation is as represented in the following equation (4), and the read transistor $M1_{m-1,n}$ is turned ON.

$$V_{RWL}-V_{RBL}=V_{sn}1-V_{RBL}>V_{sn}1-V_{th}-V_{RBL}>0 \quad (4)$$

Then, the read bit line $RBL_n$ is decreased to an intermediate potential $V_{1/2}$ between a high level potential and a low level potential of the read word line RWL, and a current continues to flow in a direction from $RWL_{m-1}$ to $RWL_m$ until the read word line $RWL_m$ is changed to a high level. Also, when the potential relation becomes as represented by the above-stated equation (4), currents flow from not only the read transistor $M1_{m-1,n}$ but also all read transistors M1 connected to the same read bit line $RBL_n$ and having the storage information of "1". Thus, in order to prevent an excessive current concentration and destruction of the read transistor $M1_{m,n}$, it is preferable that the read operation is finished before the potential relation represented by the above equation (4) is obtained.

Next, the potential of the read bit line RBL obtained through the above read operation is inputted to the sense amplifier. At this time, a relation in magnitude with respect to a reference potential $V_{ref}$ set between the precharge potential $V_{pre}$ and $V_{1/2}$ is detected by the sense amplifier SA, and it is determined as storage information.

Figure 4:
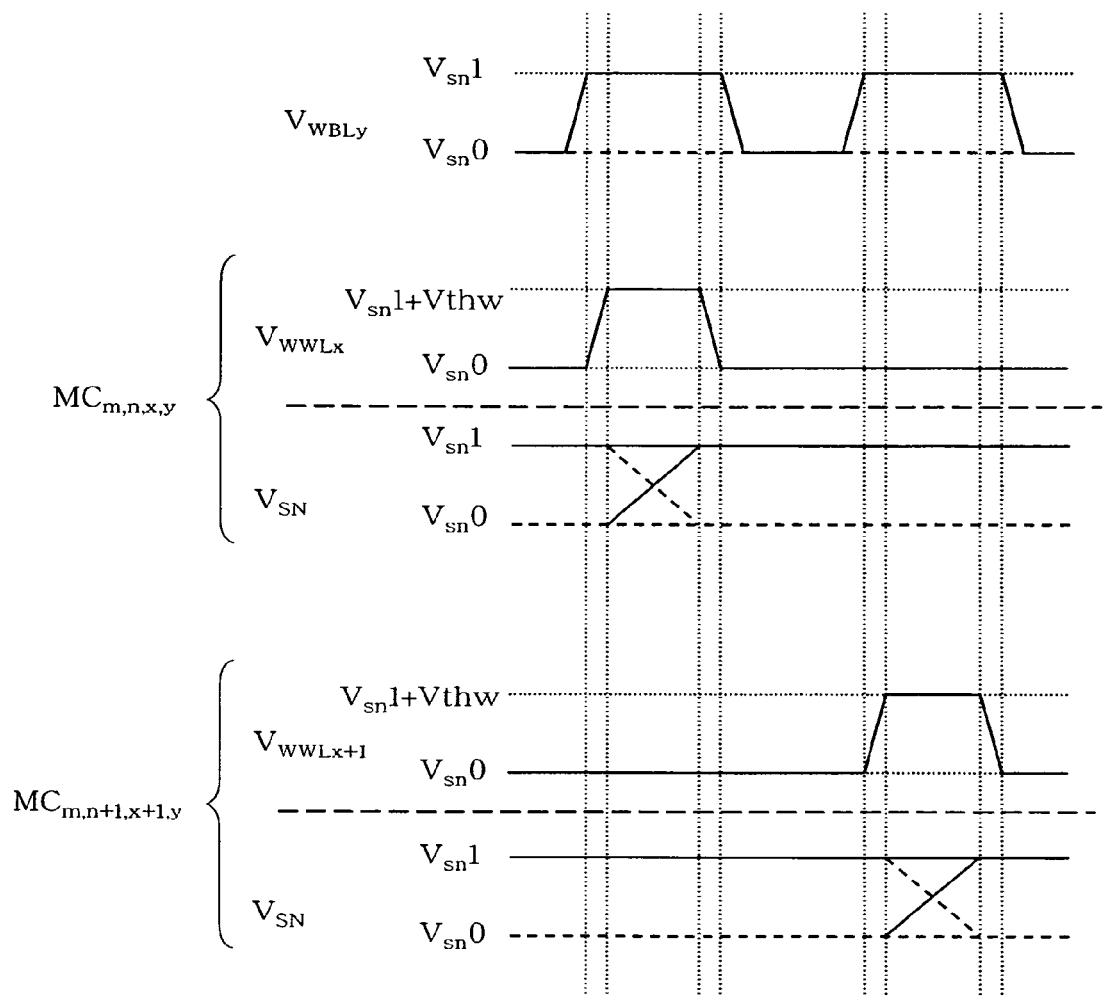
FIG. 4 is a timing chart showing signal waveforms at the time of a write operation of the semiconductor memory elements in the first to fourth embodiments of the present invention.

FIG. 4 depicts a potential relation among wirings at the time of a write operation to the memory cell MC. Potentials corresponding to the storage information of "0" is represented by broken lines, and potentials corresponding to the storage information of "1" and those corresponding to operations common to "1" and "0" are represented by solid lines.

When the write transistor M2 is not selected, a potential $V_{VBL}$ of the write bit line WBL is held at a potential (for example, $V_{sn}0$) between the potential $V_{sn}0$ at the time when "0" is written in the storage node SN and the potential $V_{sn}1$ at the time when "1" is written therein, and the potential $V_{WWL}$ of the word line WWL is set at a low level, that is, held at a potential $(V_{sn}0+V_{thW})$ or lower (for example, $V_{sn}0$), which is the potential obtained by adding a threshold voltage $V_{thW}$ of the write transistor M2 to the potential $V_{sn}0$ at the time when "0" is written in the storage node SN. Therefore, in both cases where the potential of the storage node SN corresponds to the storage information of "1" and where that potential corresponds to the storage information of "0", the gate electrode potential with respect to the source and drain of the write transistor M2 is equal to or lower than the threshold voltage $V_{thW}$. Therefore, the write transistor M2 is in an OFF state. Thus, the following equation (5) holds.

$$V_{sn}1 \geq V_{WBL} \geq V_{sn}0 \geq V_{WWL}-V_{thW} \quad (5)$$

At the time of a write operation, the potential of the write bit line WBL is set at a potential corresponding to the information to be written. Then, the potential of the write word line WWL is set at a high level, that is, set to a value $(V_{sn}1+V_{thW})$ or higher obtained by adding the threshold voltage $V_{thW}$ of the write transistor to the potential $V_{sn}1$ at the time when "1" is written in the storage node SN. In this manner, the write transistor M2 is turned ON irrespective of the storage information of the storage node SN. At this time, the following equation (6) holds $$V_{WWL}-V_{thW} \geq V_{sn}1 \geq V_{WBL} \quad (6)$$

At this time, the potential of the storage node SN is changed depending on the potential set in advance on the write bit line WBL. Then, by setting the potential of the write word line WWL at a low level, the write operation is finished and the storage information is retained.

Figure 5:
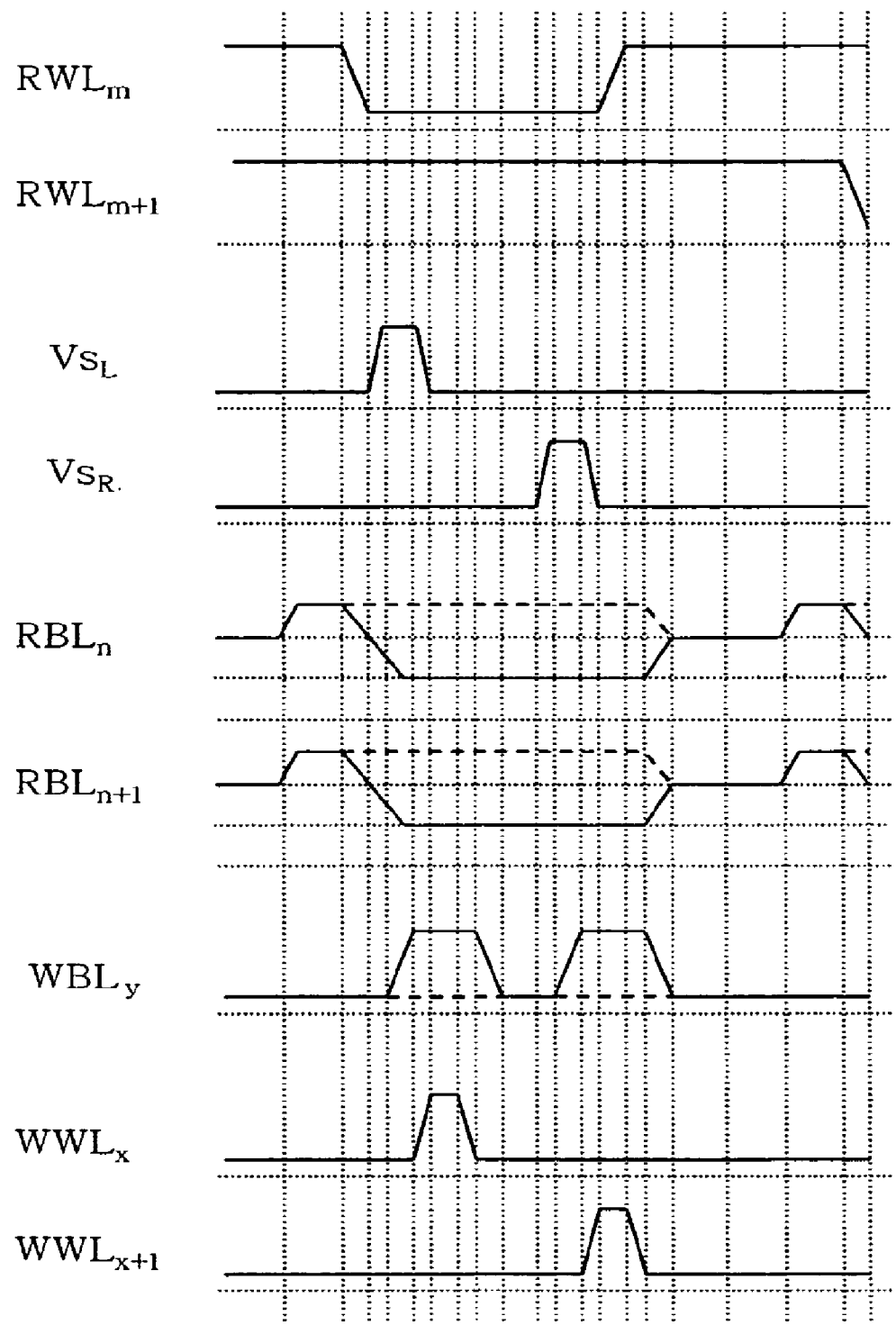
FIG. 5 is a timing chart showing signal waveforms at the time of a refresh operation in a first operation mode of the semiconductor memory device according to the first, third, and fourth embodiments of the present invention.
Figure 6:
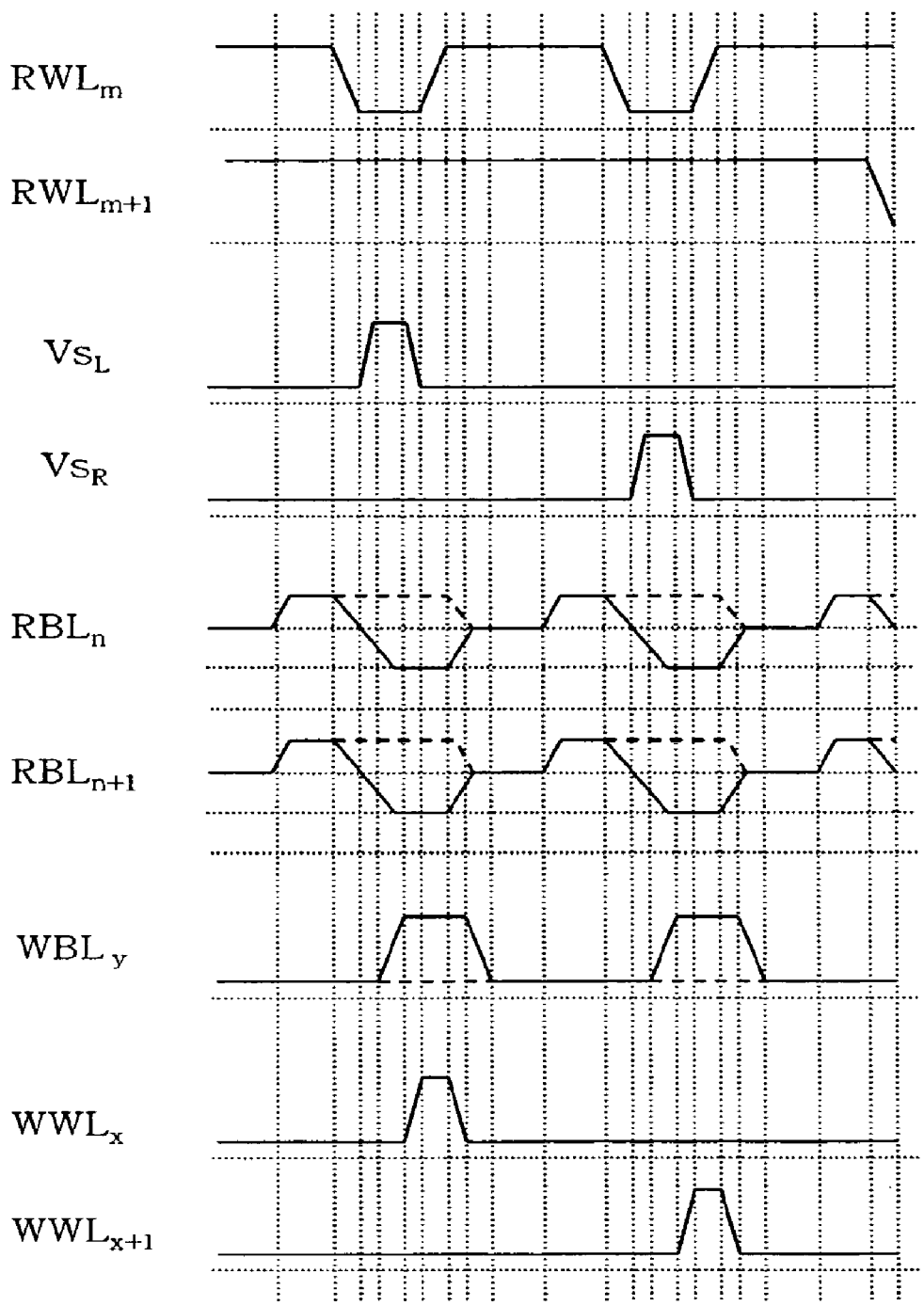
FIG. 6 is a timing chart showing signal waveforms at the time of a refresh operation in a second operation mode of the semiconductor memory device according to the first, third, and fourth embodiments of the present invention.

FIG. 5 and FIG. 6 depict a refresh operation of the memory cell $MC_{m,n,x,y}$ and the memory cell $MC_{m,n+1,x+1,y}$ connected to the read word line $RWL_m$ in FIG. 2 according to the present embodiment. FIG. 5 depicts a potential relation among wirings and timing in a first operation mode for refreshing two memory cells with one read operation, and FIG. 6 depicts those in a second operation mode for refreshing one memory cell with one read operation. Note that, to prevent inconvenience, the magnitude of each potential is not shown, but is assumed to be equivalent to each corresponding potential in FIG. 3 and FIG. 4.

In the first operation mode, since two memory cells are refreshed with one read operation, a refreshing time for each read word line can be shortened However, since two memory cells are refreshed with the potential of the read word line being at a low level, the potential relation is as represented by the above equation (4), and there is the possibility that the time period in which current flows between the read word lines is increased.

In the second operation mode, since one memory cell is refreshed with one read operation, the time period in which the read word line is held at a low level can be shortened, and when the potential relation is as represented by the above equation (4), consumption of current flowing between read word lines can be reduced.

In the above-described read and write operations, the read word line RWL, the read bit line RBL, the write word line WWL, and the write bit line WBL are separately provided. Therefore, each potential can be arbitrarily set. For this reason, even if there are variations in threshold voltage of the transistors, a sufficient operation margin can be ensured.

Also, since the memory cell according to the present embodiment has a structure of a two-transistor type, by connecting a memory cell to the same read word line and write bit line as those of an adjacent memory cell, a small-area memory cell array can be obtained.

Any transistor can be used as the read transistor M1 for use in the present embodiment as long as it has a structure in which a channel conductance can be controlled by the amount of charge accumulated in the gate electrode serving as the storage node. Also, any transistor can be used as the write transistor M2 as long as it has a switching characteristic capable of controlling the amount of charge of the storage node.

Second Embodiment

In a memory cell MC according to a second embodiment, a write transistor M2, a read transistor M1, and a connecting relation among wirings are basically identical to those in the above-described first embodiment. However, Schottky connection is used for the contact between the drain of the read transistor M1 and read bit lines RBL. By doing so, it is possible to obtain an effect of preventing a current from flowing between read word lines RWL in the case where the potential relation is as represented by the equation (4) in the first embodiment.

Figure 7:
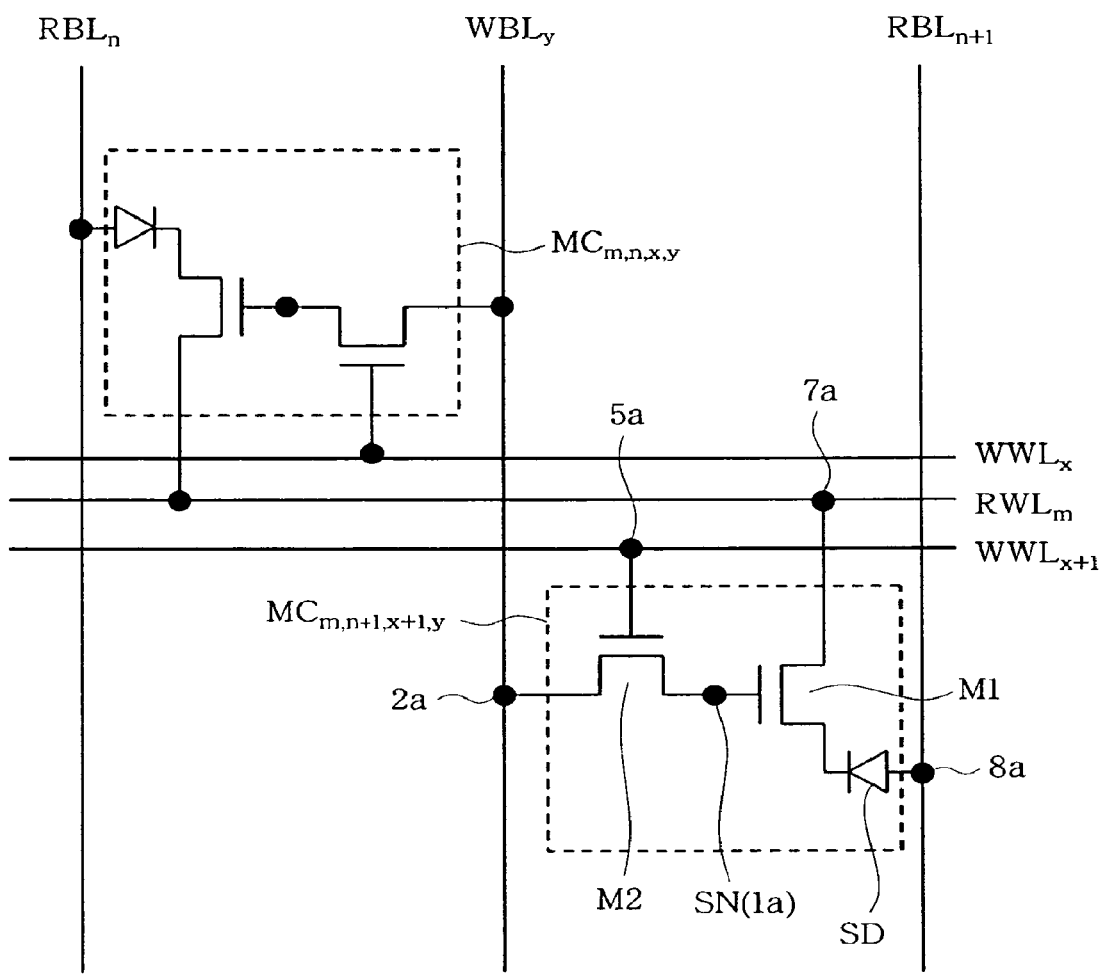
FIG. 7 is a drawing of an equivalent circuit showing a connecting relation between memory cells and wirings which form a semiconductor memory device according to second to fifth embodiments of the present invention.
Figure 8:
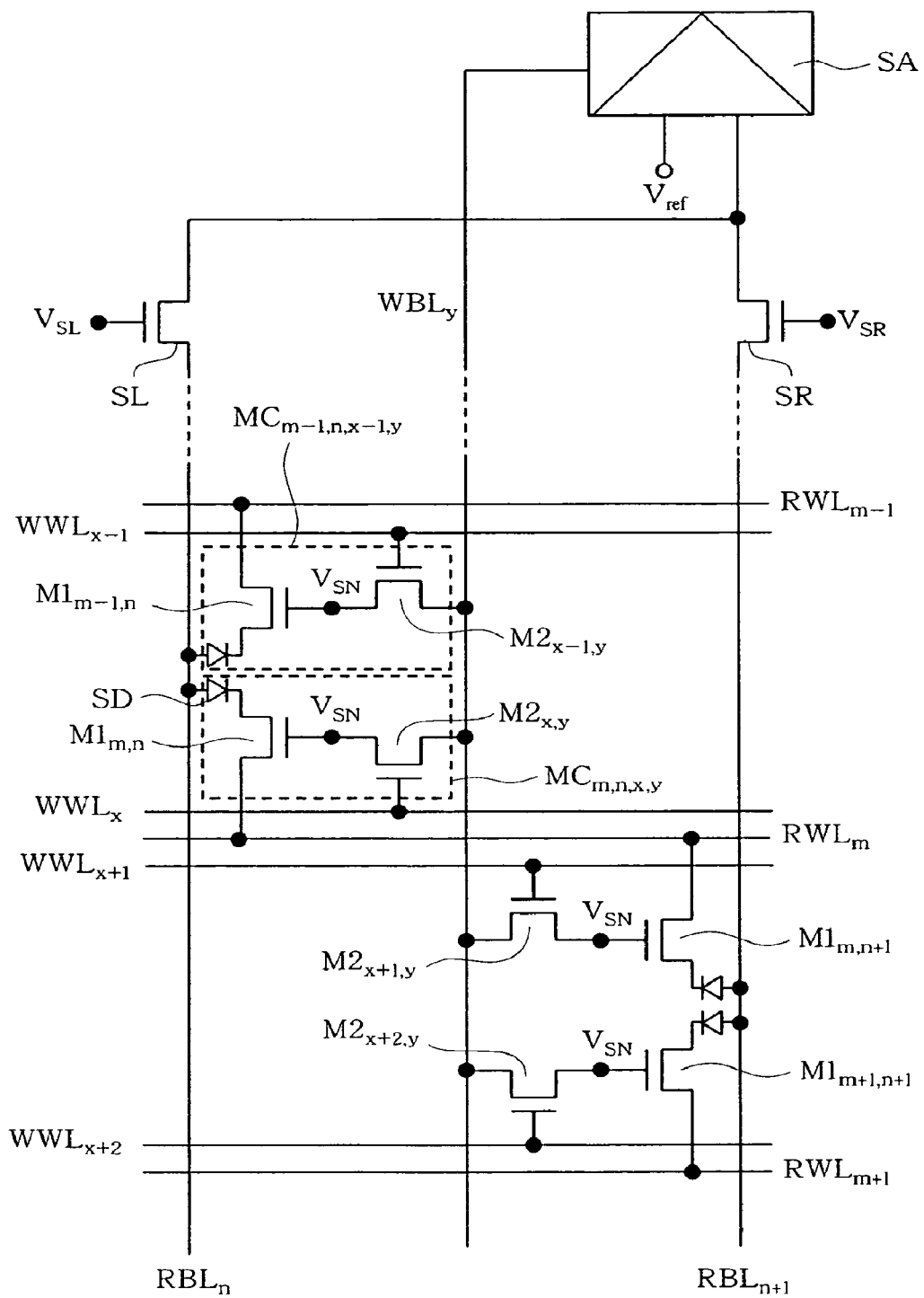
FIG. 8 is a drawing of an equivalent circuit showing a part of the semiconductor memory device according to the second embodiment of the present invention.

FIG. 7 and FIG. 8 depict equivalent circuits each showing a connecting relation between the memory cells MC and wirings in the second embodiment. SD denotes a Schottky diode in Schottky connection.

Figure 9:
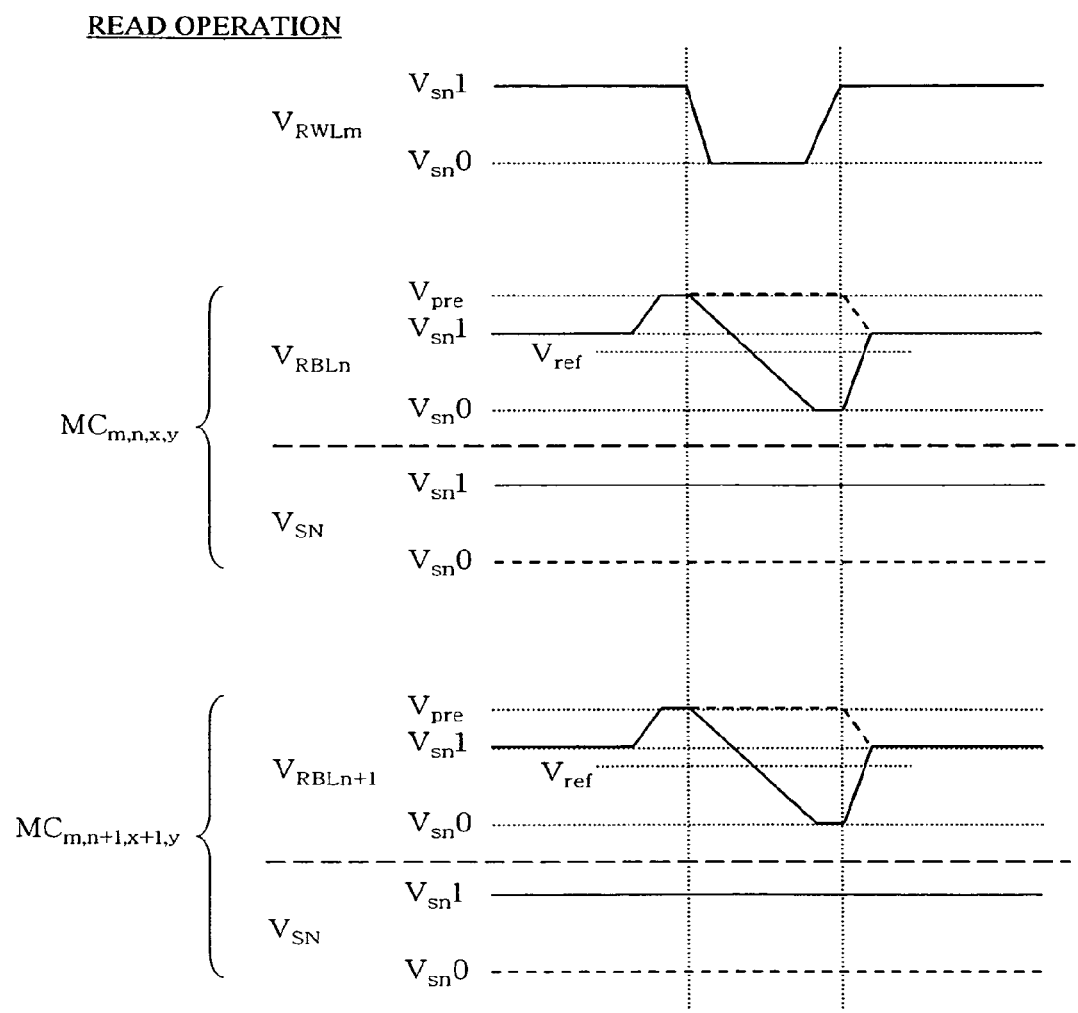
FIG. 9 is a timing chart showing signal waveforms at the time of a read operation of the semiconductor memory elements in the second embodiment of the present invention.

Also, FIG. 9 depicts a read operation of the memory cell MC in the second embodiment. The principle of a read operation is basically identical to that in the first embodiment. However, in the case of the above-mentioned Schottky connection, even if the potential of the read bit line RBL is decreased, the current does not flow from the read transistors M1 having the storage information of "1" and connected to the same read bit line RBL. Therefore, the potential of the read bit line RBL is decreased to a low level potential $V_{sn}0$.

The potentials read to a read bit line $RBL_n$ and a read bit line $RBL_{n+1}$ in the above-described read operation are sequentially inputted to a sense amplifier SA under the control of selection transistors SL and SR. At this time, a relation in magnitude with a reference potential $V_{ref}$ set between the precharge potential $V_{pre}$ and $V_{sn}0$ is detected by the sense amplifier SA and it is determined as storage information. After the selection transistor SR is turned ON and a potential corresponding to the information stored in the storage node of the read transistor $M1_{m,n+1}$ is latched to a write bit line $WBL_y$ by the sense amplifier SA, the potential of the read word line $RWL_m$ is returned to a holding potential, thereby finishing the read operation of the read word line $RWL_m$.

The read operation in the second embodiment can be performed while holding the write transistor M2 in an OFF state, without changing the potential of the write word line WWL. Therefore, the storage information can be read without destruction.

A write operation is identical to that in the first embodiment shown in FIG. 4.

Figure 10:
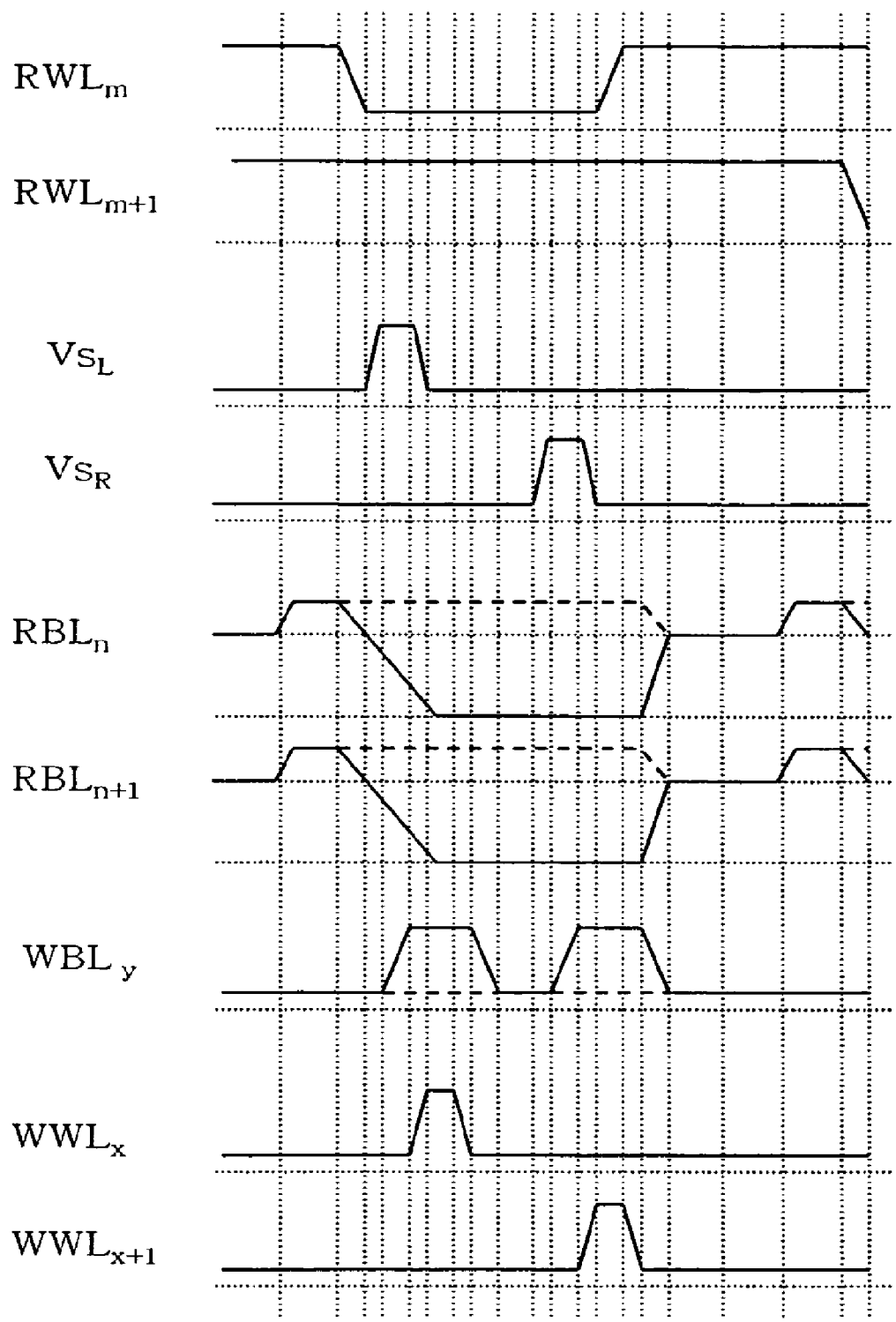
FIG. 10 is a timing chart showing signal waveforms at the time of a refresh operation in a first operation mode of the semiconductor memory device according to the second embodiment of the present invention.
Figure 11:
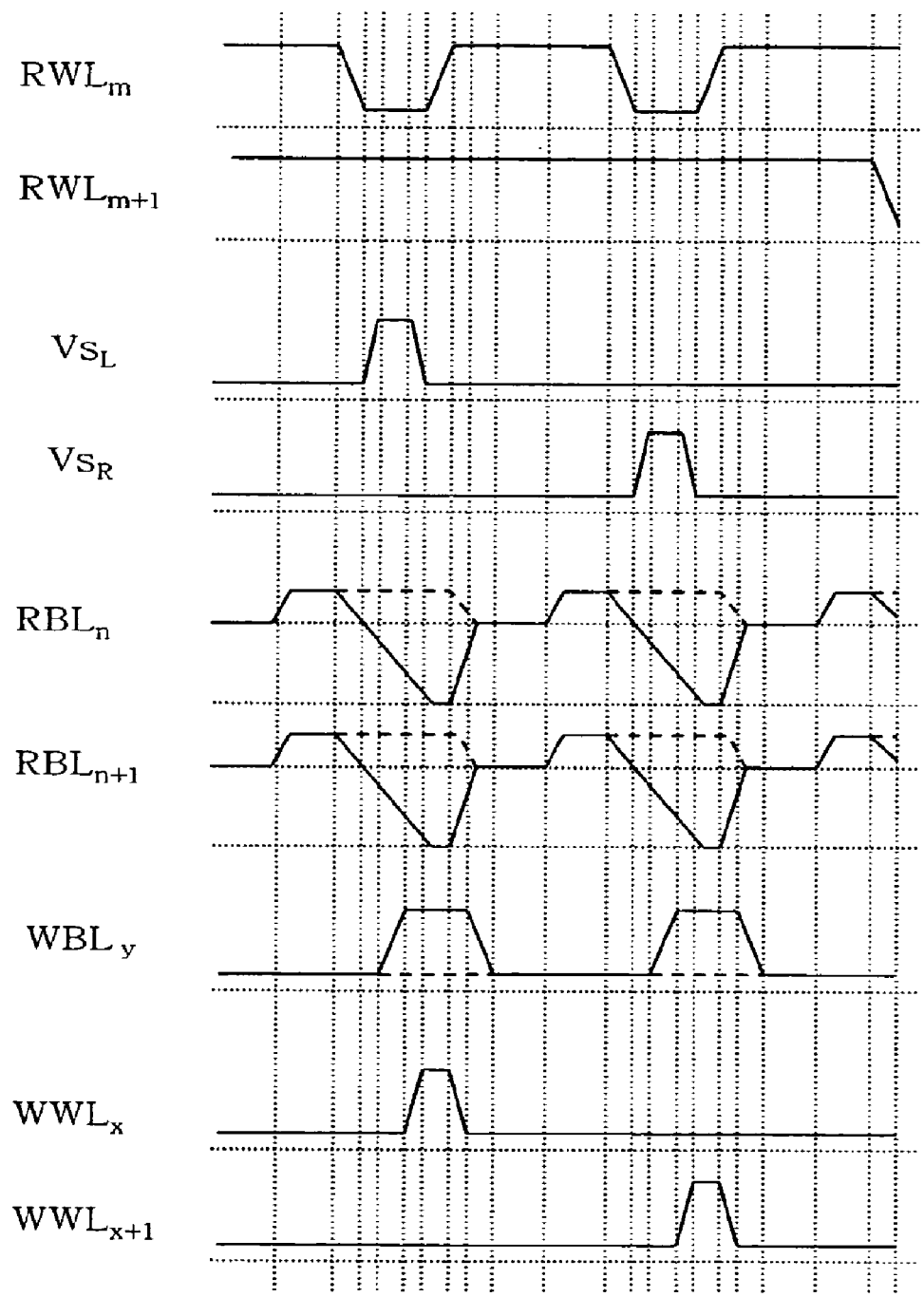
FIG. 11 is a timing chart showing signal waveforms at the time of a refresh operation in a second operation mode of the semiconductor memory device according to the second embodiment of the present invention.

FIG. 10 and FIG. 11 depict a refresh operation of the memory cells $MC_{m,n,x,y}$ and $MC_{m,n+1,x+1,y}$ connected to the read word line $RWL_m$ in FIG. 8 according to the second embodiment. FIG. 10 depicts a potential relation among wirings and timing in a first operation mode for refreshing two memory cells with one read operation, and FIG. 11 depicts those in a second operation mode for refreshing one memory cell with one read operation. Note that, to prevent inconvenience, the magnitude of each potential is not shown, but is assumed to be equivalent to each corresponding potential in FIG. 9 and FIG. 4.

Third Embodiment

A third embodiment has a structure based on the second embodiment, in which an impurity diffused layer of an adjacent memory cell is used as a drain region of the read transistor M1 and the read transistor is connected to the read bit line RBL through a Schottky connection. Also, a thin-film transistor is used as the write transistor M2. Since the drain region is shared with the read transistor M1 of the adjacent memory cell, an effect of reducing the memory cell area can be achieved.

Figure 12:
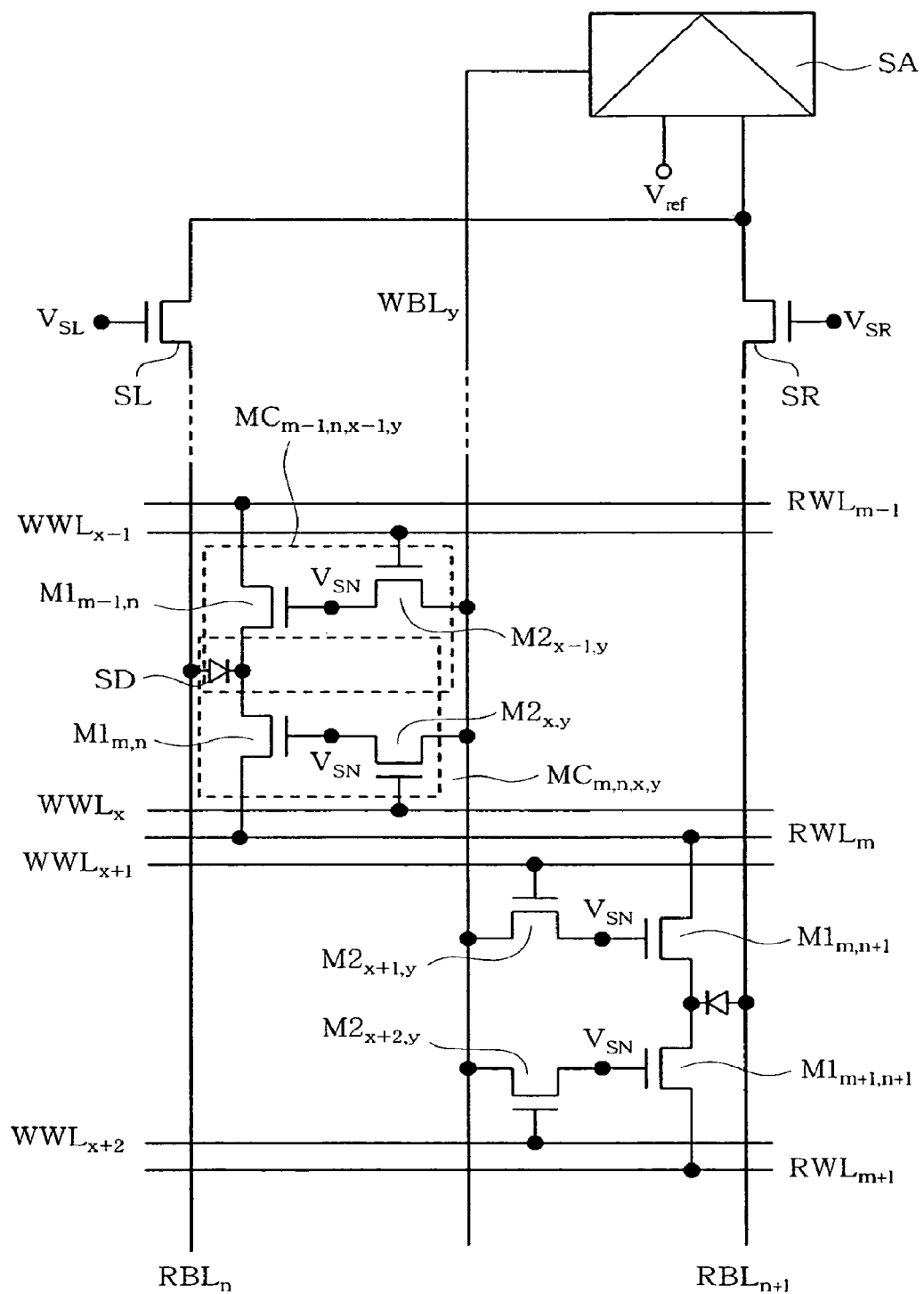
FIG. 12 is a drawing of an equivalent circuit showing a part of the semiconductor memory device according to the third and fourth embodiments of the present invention.

FIG. 12 is a drawing of an equivalent circuit showing a part of a memory cell array according to the third embodiment. The structure of a memory cell is identical to that in FIG. 7.

Figure 13:
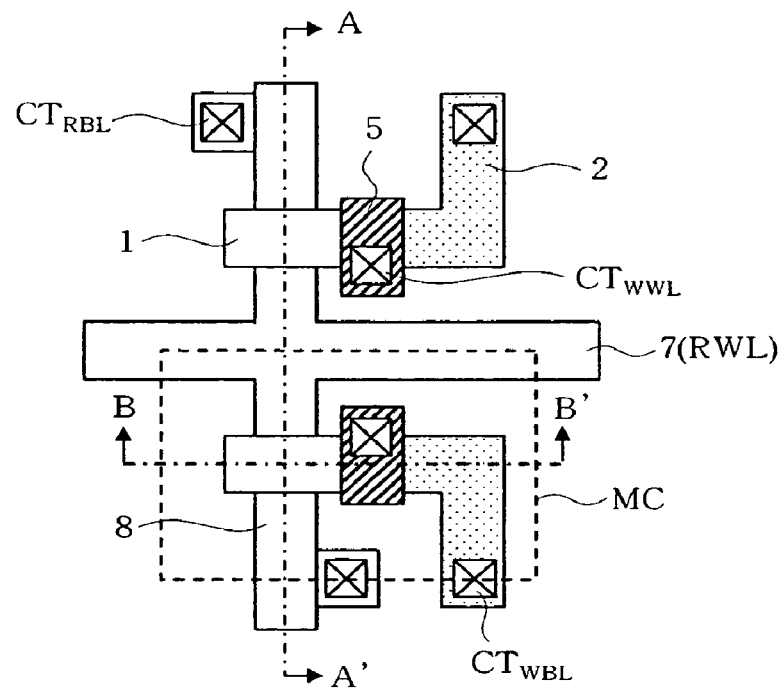
FIG. 13A is a top view of a part of the semiconductor memory device according to the third embodiment of the present invention.
FIG. 13B is a cross-sectional view of the semiconductor memory device taken along an A-A' section in FIG. 13A.
FIG. 13C is a cross-sectional view of the semiconductor memory device taken along a B-B' section in FIG. 13A.
Figure 13:
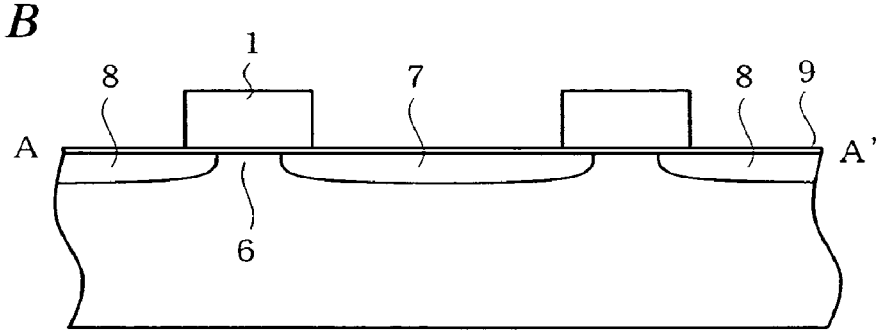
Figure 13:
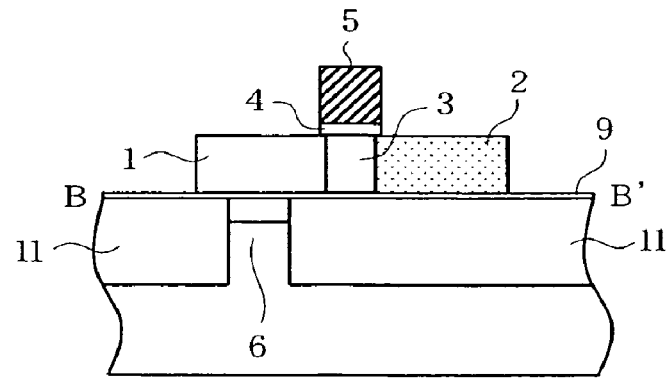
Figure 14:
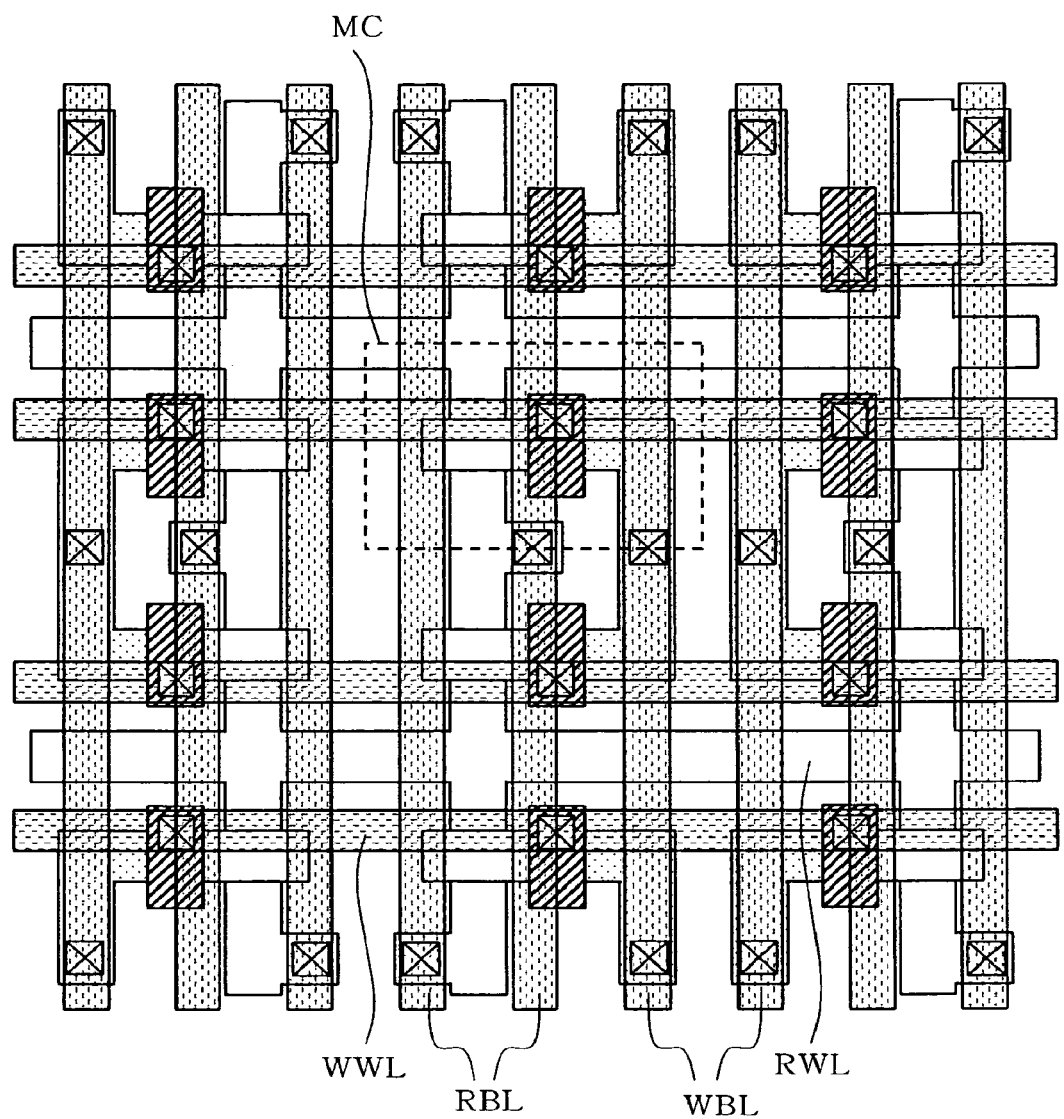
FIG. 14 is a top view of the structure of a memory cell array of the semiconductor memory device according to the third embodiment of the present invention.

FIG. 13A to FIG. 13C and FIG. 14 depict the structure of memory cells forming the memory cell array and the memory cell array according to the third embodiment. FIG. 13A is a top view of the memory cell, FIG. 13B and FIG. 13C are cross-sectional views of the memory cell in FIG. 13A taken along an A-A' section and a B-B' section, respectively. FIG. 14 is a top view of the memory cell array. Note that, for ease of viewing, in FIG. 13A to FIG. 13C and FIG. 14, portions where outlines are overlapped with each other in a certain region are shown as being shifted. Also, these top views and cross-sectional views merely represent a relation in arrangement of main portions of the semiconductor memory device, and do not necessarily represent the state of each layer accurately.

In the top views and cross-sectional views according to the third embodiment, an impurity diffused layer wiring using the source of the read transistor M1 as the read word line RWL is shown. However, if wiring resistance is not negligible, a space is required among wirings, which increases the area. However, it is also possible to take a contact at the source of the read transistor M1 so as to connect the metal wiring.

In the memory cell structure according to the present embodiment, the write transistor M2 using a thin-film transistor M2 and the read transistor M1 are integrated.

The write transistor M2 is a thin-film transistor. A channel 3 of this thin-film transistor has a low impurity concentration but n-type impurities are implanted into both ends thereof (a source region 1 of the write transistor and a drain region 2 of the write transistor). No electric conduction path other than the channel 3 is present at one of these ends (the source region 1 of the write transistor), and the end serves as a charge accumulating unit. This end portion (the source region 1 of the write transistor) corresponds to a portion of SN (1a) in the drawing of the equivalent circuit shown in FIG. 7. On the other hand, the other end (the drain region 2 of the write transistor) is connected to the write bit line WBL. Also, a gate electrode 5 of the write transistor M2 is connected to a write word line WWL. The portions of the drain region 2 of the write transistor and the gate electrode 5 of the write transistor M2 correspond to portions 2a and 5a in the drawing of the equivalent circuit shown in FIG. 7. The charge accumulating unit (the source region 1 of the write transistor) also serves as a gate electrode of the read transistor M1, which changes the current flowing between the source region 7 of the read transistor and the drain region 8 of the read transistor in accordance with the accumulated amount of charge. The source region 7 of the read transistor and the drain region 8 of the read transistor are n type regions with high impurity concentration provided in a p type silicon substrate.

In the present embodiment and the following embodiments, names such as source and drain are used for convenience. However, since the potential relation may be reverse, the names can be used in a reverse manner. Also, for the purpose of simplification of process steps, an impurity diffused layer is designed to have the simplest structure. Alternatively, a more complex structure resistant to a short channel effect can be also adopted. Furthermore, although electrons are used as carriers, positive holes may be used as carriers. If positive holes are used as carriers, the relation in voltage magnitude and the direction of the current are changed.

Next, a manufacturing process of a semiconductor memory device according to the third embodiment will be described. FIG. 15A to FIG. 15C, FIG. 16A to FIG. 16C, and FIG. 17A to FIG. 17C are top views and cross-sectional views for two basic memory cells showing a connection relation with wirings in each step for manufacturing a memory cell array according to the third embodiment. In FIG. 15 to 17, FIG. 15A, FIG. 16A, and FIG. 17A are top views, FIG. 15B, FIG. 16B, and FIG. 17B are cross-sectional views taken along each A-A' section in FIG. 15A, FIG. 16A, and FIG. 17A, and FIG. 15C, FIG. 16C, and FIG. 17C are cross-sectional views taken along each B-B' section in FIG. 15A, FIG. 16A, and FIG. 17A.

Note that, for preventing complication, these top views merely represent locations of main portions in the corresponding processes and do not necessarily correspond to accurate top views. Also, each cross-sectional view illustrates the structure example of the portion above a semiconductor layer which forms the active regions of the semiconductor memory device. This semiconductor layer is disposed on a semiconductor substrate or a Silicon on Insulator (SOI) substrate. However, the illustration of this substrate portion is omitted in each drawing for the purpose of simplification of the drawings.

First, impurity ions are implanted into a p type silicon substrate 6 and then the substrate 6 is annealed, thereby forming a normal triple-well structure of n well and p well.

Figure 15A:
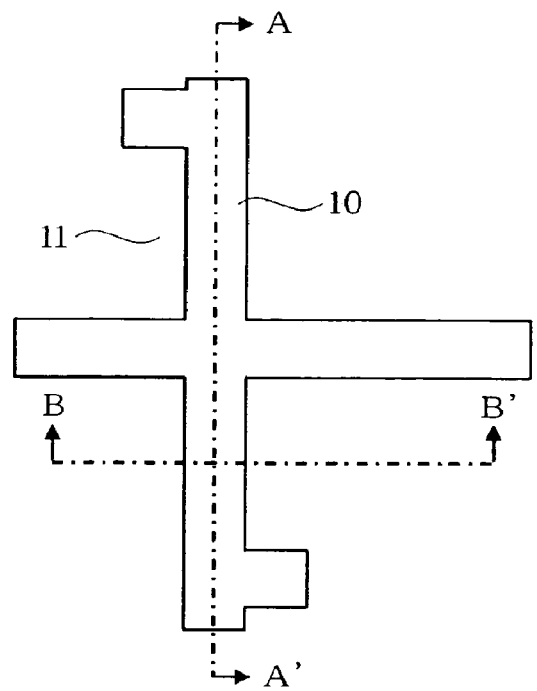
FIG. 15A is a top view for describing a manufacturing process of the semiconductor memory device according to the third embodiment of the present invention.
Figure 15B:
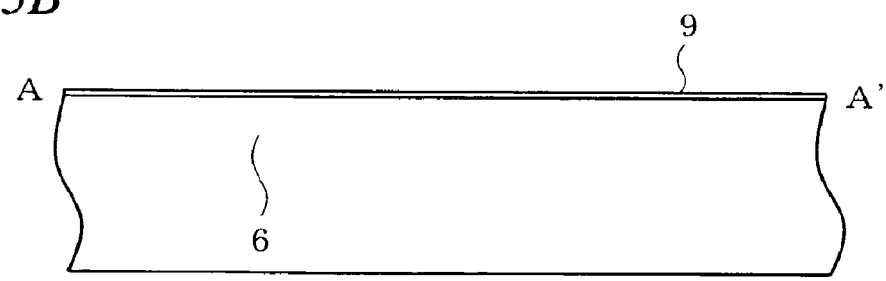
FIG. 15B is a cross-sectional view of the semiconductor memory device taken along an A-A' section in FIG. 15A.
Figure 15C:
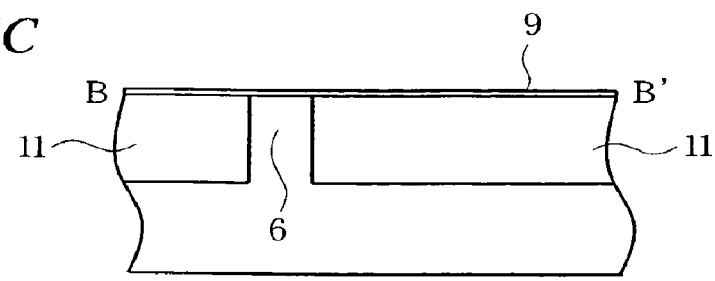
FIG. 15C is a cross-sectional view of the semiconductor memory device taken along a B-B' section in FIG. 15A.

Also, by using a mask pattern 10 shown in the top view of FIG. 15A, a normal trench for device isolation (device isolation region 11) filled with insulator is formed. More specifically, the device isolation region 11 is formed within the mask pattern 10. Furthermore, when a plurality of devices are to be formed, a plurality of the mask patterns 10 are arranged.

After sacrificial oxidation on the substrate surface, impurity ions for adjusting the threshold voltage are implanted with using a resist as a mask. After cleaning, a silicon surface is oxidized to form a gate insulating film for a peripheral circuit having a thickness of 5 nm. Next, a $SiO_2$ film is etched with using a resist pattern, in which a transistor portion for a logic circuit is opened, as a mask region.

Then, after the resist film is removed, the silicon surface is oxidized so as to have a thickness of 3 nm to form a gate insulating film for a logic circuit. After the dielectric constant of the gate insulating film is increased by nitriding the surface of the gate insulating film, polysilicon for a gate electrode is deposited. Then, impurities are implanted into the polysilicon with using a resist as a mask. At this time, the mask is placed so that impurities are not implanted to a region to be a channel of a write transistor.

Figure 16A:
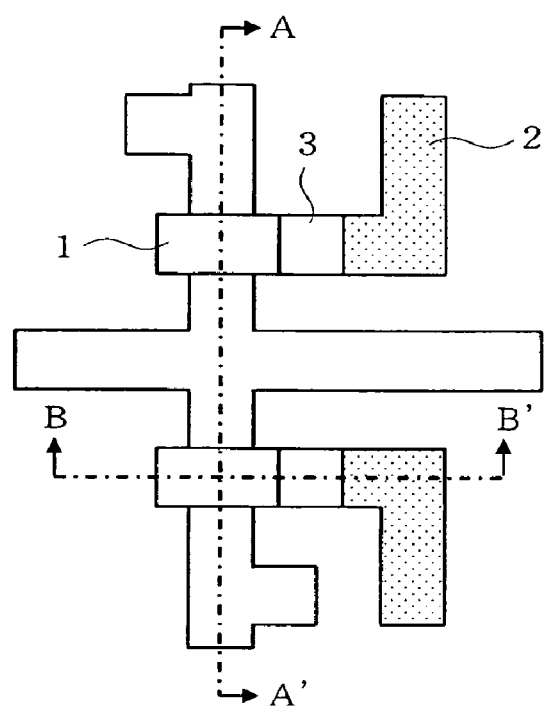
FIG. 16A is a top view for describing the manufacturing process of the semiconductor memory device according to the third embodiment of the present invention.
Figure 16B:
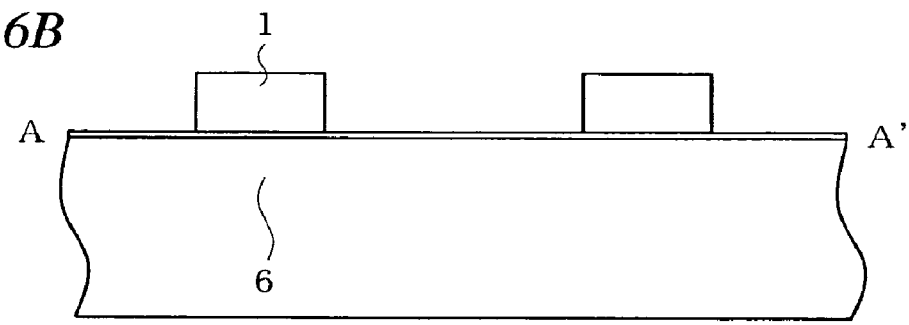
FIG. 16B is a cross-sectional view of the semiconductor memory device taken along an A-A' section in FIG. 16A.
Figure 16C:
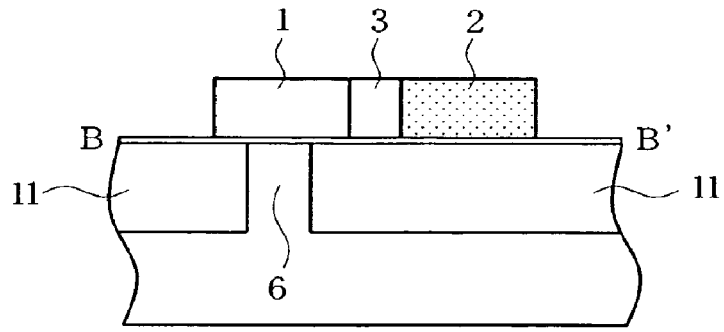
FIG. 16C is a cross-sectional view of the semiconductor memory device taken along a B-B' section in FIG. 16A.

Furthermore, as shown in FIG. 16A, the polysilicon is processed with using a resist pattern as a mask, thereby forming a gate electrode (the source region 1 of the write transistor), a drain region 2 of the write transistor, and a channel 3 of the write transistor. At this time, in a repeated pattern in the memory cell, distances between gate electrodes are made approximately equal to one another. By doing so, a super-resolution technology such as a phase shift exposure can be used.

Then, polysilicon for a gate insulating film 4 of the write transistor and a gate electrode 5 of the write transistor is deposited, and the polysilicon is processed with using the resist pattern as a mask as shown in FIG. 17. Thereafter, when the implantation for a high-withstand-voltage transistor for a peripheral circuit is performed, impurities are implanted to a contact region with the read bit line so as to form n type impurity diffused regions with low impurity concentration.

Figure 17A:
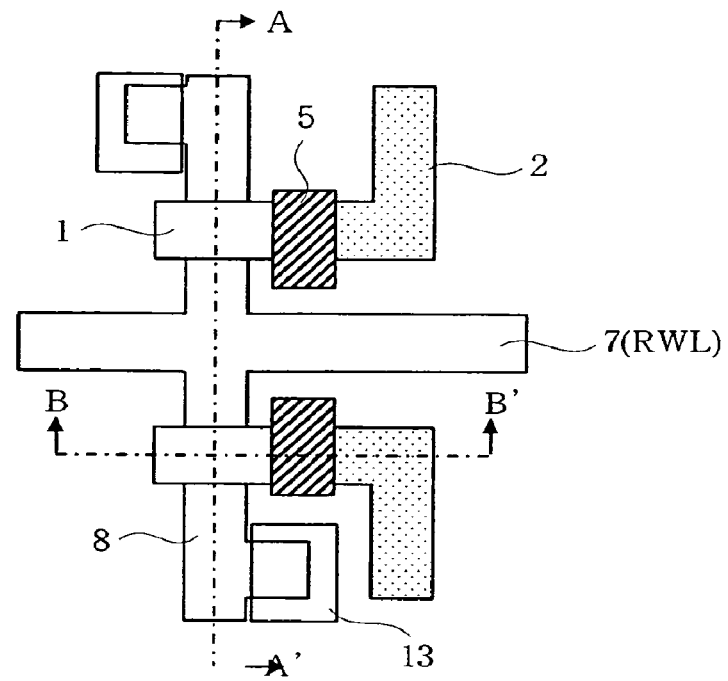
FIG. 17A is a top view for describing the manufacturing process of the semiconductor memory device according to the third embodiment of the present invention.
Figure 17B:
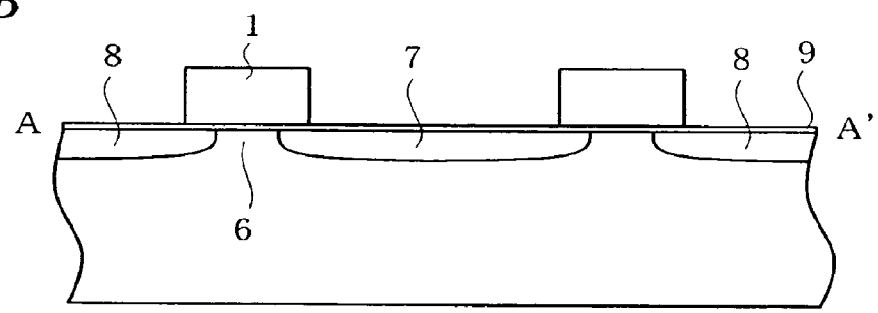
FIG. 17B is a cross-sectional view of the semiconductor memory device taken along an A-A' section in FIG. 17A.
Figure 17C:
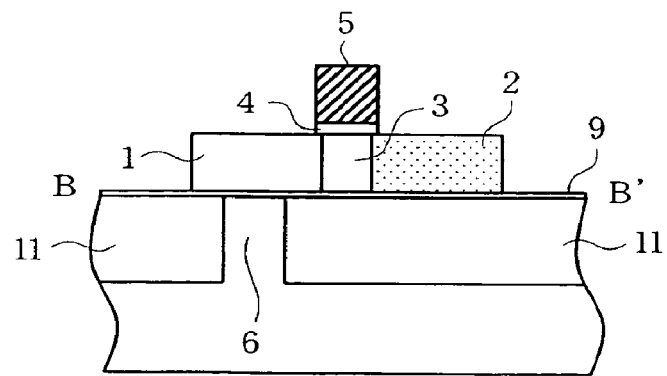
FIG. 17C is a cross-sectional view of the semiconductor memory device taken along a B-B' section in FIG. 17A.

Furthermore, as shown in FIG. 17A, impurities are implanted with using the resist pattern 13 and the gate electrode as masks, thereby forming a source region 7 of the read transistor and a drain region 8 of the read transistor. At this time, since the contact region (read bit line contact $CT_{RBL}$) connected to the read bit line is covered with the resist pattern 13, the impurity concentration is low. Also, instead of the impurity implantation for a high-withstand-voltage transistor onto the contact region, another impurity implantation may be performed to adjust the impurity concentration.

Before and after this impurity implantation described above, a process of diagonally implanting impurities having a polarity different from that of the impurity diffused layer to increase a well concentration of the end portion of the gate electrode can be performed so as to suppress a short channel effect. Here, in order to reduce the resistance of the impurity diffused layer, a silicide process is performed. For example, a titanium silicide or cobalt silicide is formed.

Then, after a $SiO_2$ film is deposited and then planarized, a contact process and a wiring process are performed. At this time, the read bit line contact $CT_{RBL}$ on the drain region 8 side of the read transistor has a low impurity concentration, and therefore has a Schottky junction.

Next, the operation in the memory array in the present embodiment will be described. For example, in the equivalent circuit shown in FIG. 12, when the storage information of the memory cell $MC_{m,n,x,y}$ is read, the read bit lines $RBL_n$ and $RBL_{n+1}$ are precharged, and the potential of the read word line $RWL_m$ is changed to a low level. As a result, a potential corresponding to the storage information of the memory cell $MC_{m,n,x,y}$ can be obtained on the read bit line $RBL_n$. Here, in the memory cell according to the present embodiment, the drain of the read transistor $M1_{m,n}$ also serves as the drain of the read transistor $M1_{m-1,n}$ and is connected to the read bit line $RBL_n$. Therefore, when the potential of the read bit line $RBL_n$ is decreased to a potential satisfying the potential relation represented by the above-described equation (4), the read transistor $M1_{m-1,n}$ is turned ON. Then, similar to FIG. 3, the potential of the read bit line $RBL_n$ is decreased to the intermediate voltage $V_{1/2}$ between $V_{sn}1$ and $V_{sn}0$, and current continues to flow in a direction from the read word line $RWL_{m-1}$ to the read word line $RWL_m$ until the potential of the read word line $RWL_m$ is returned to a high level. Accordingly, it is preferable that the reference potential $V_{ref}$ of the sense amplifier SA is set between the precharge potential $V_{pre}$ and the holding voltage $V_{sn}1$ of the read bit line $RBL_n$ and the read operation is finished before the potential of the read bit line is decreased to the potential represented by the above-described equation (4).

Then, by changing the potential of the read word line $RWL_m$ to a high level, the read operation is finished.

The write operation is identical to that in the first embodiment shown in FIG. 4.

As described above, the refresh operation of the memory cell $MC_{m,n,x,y}$ and the memory cell $MC_{m,n+1,x+1,y}$ connected to the read word line $RWL_m$ shown in FIG. 12 according to the third embodiment is identical to that according to the first embodiment shown in FIG. 5 and FIG. 6.

The use of the thin-film transistor for writing in the third embodiment is not restricted to the memory cell array structure shown in FIG. 12, but it may be applied to the memory cells described in the first and second embodiments. Also, the write transistor M2 and the read transistor M1 do not have special characteristics and can perform a read operation and a write operation only with the potential of the wiring. Therefore, the transistors to be used are not restricted to the above-described thin-film transistors, and transistors formed through a general manufacturing process can be used.

Fourth Embodiment

A fourth embodiment has a structure based on the third embodiment, in which an ultra-thin channel thin-film transistor (TFT) having a channel thickness of about 5 nm or smaller and reducing an off-leakage current is used as the write transistor M2 and it is spatially formed on the read transistor. Thus, the memory cell array structure is similar to that in the third embodiment shown in FIG. 12, but the memory cell area can be reduced.

Figure 18A:
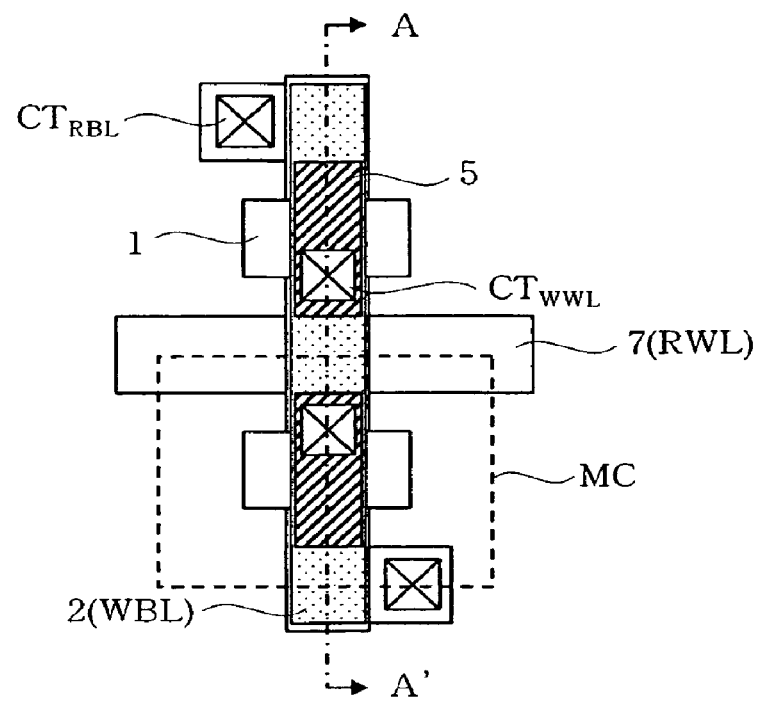
FIG. 18A is a top view of a part of the semiconductor memory device according to the fourth embodiment of the present invention.
Figure 18B:
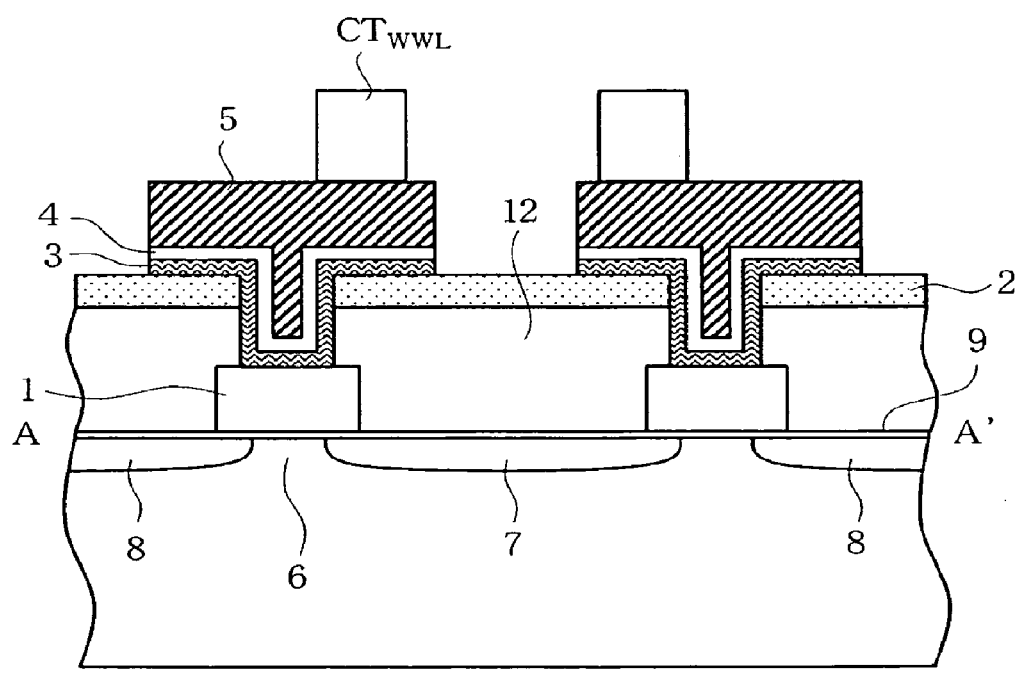
FIG. 18B is a cross-sectional view of the semiconductor memory device taken along an A-A' section in FIG. 18A.
Figure 19:
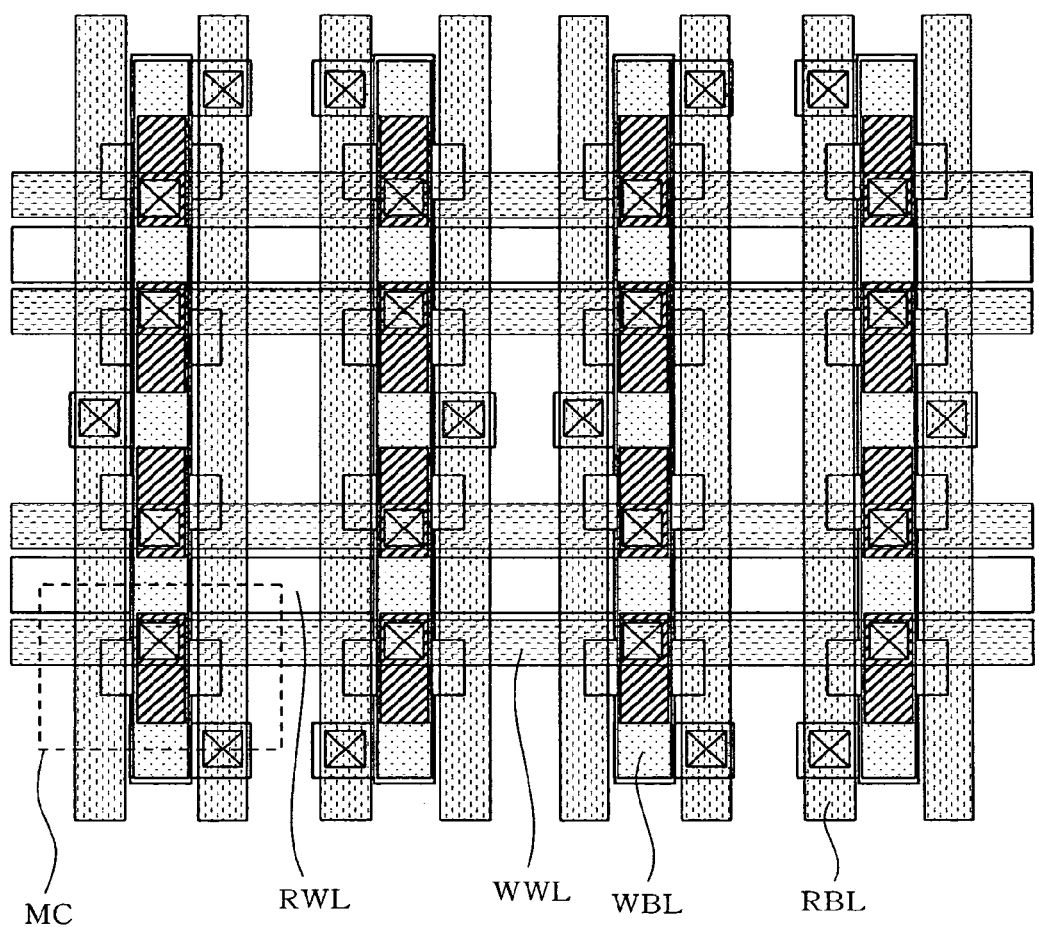
FIG. 19 is a top view of the structure of a memory cell array of the semiconductor memory device according to the fourth embodiment of the present invention.
Figure 20A:
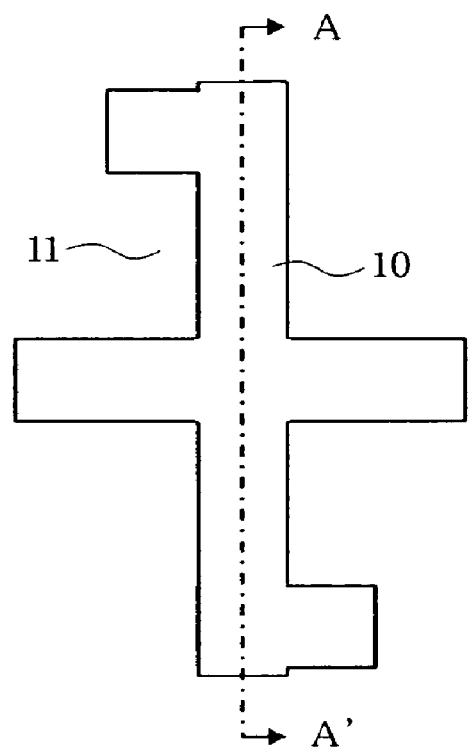
FIG. 20A is a top view for describing a manufacturing process of the semiconductor memory device according to the fourth embodiment of the present invention.
Figure 20B:
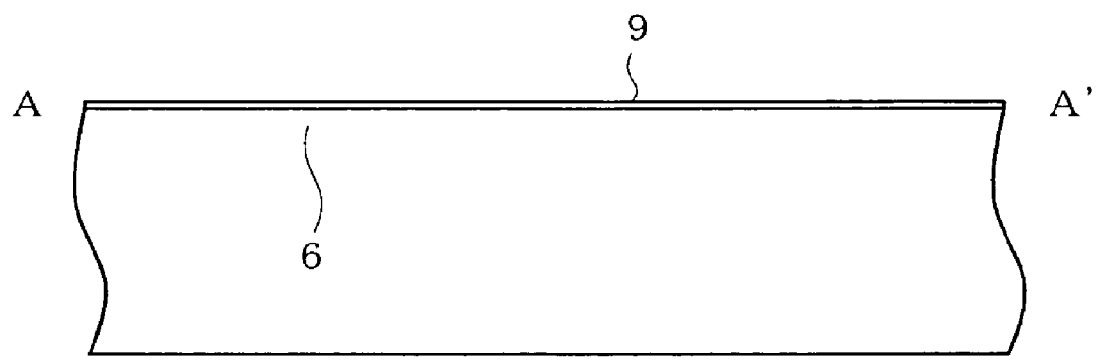
FIG. 20B is a cross-sectional view of the semiconductor memory device taken along an A-A' section in FIG. 20A.

FIG. 18A and FIG. 18B and FIG. 19 depict the structure of memory cells forming the memory cell array and the memory cell array according to the fourth embodiment. FIG. 18A is a top view of the memory cell, FIG. 18B is a cross-sectional view of the memory cell, and FIG. 19 is a top view of the memory cell array. Note that, for ease of viewing, in FIG. 18A and FIG. 18B and FIG. 19, portions where outlines are overlapped with each other in a certain region are shown as being shifted. Also, these top views merely represent a relation in arrangement of main portions of the semiconductor memory device, and do not necessarily represent the state of each layer accurately.

In the top views and cross-sectional views shown in the fourth embodiment, an impurity diffused layer wiring using the source of the read transistor M1 as the read word line RWL is shown. Also, a polysilicon wiring using the drain of the write transistor M2 as the write bit line WBL is shown. However, if wiring resistance is not negligible, a space is required among wirings, which increases the area. However, it is also possible to take a contact at the source of the read transistor M1 or the drain of the write transistor M2 so as to connect the metal wiring.

In the memory cell structure according to the fourth embodiment, the write transistor M2 using an ultra-thin channel TFT in which information is written and the read transistor M1 that reads the written information are integrated, and the write transistor M2 is spatially formed on the read transistor M1.

The write transistor M2 is an ultra-thin silicon channel thin-film transistor. The channel 3 of this thin-film transistor has a low impurity concentration and is substantially intrinsic. Also, both ends thereof (a source region 1 of the write transistor and a drain region 2 of the write transistor) are connected to polysilicon to which n type impurities are introduced. No electric conduction path other than the channel 3 is present at one of these ends (the source region 1 of the write transistor), and therefore the end serves as a charge accumulating unit. This end portion (the source region 1 of the write transistor) corresponds to a portion of SN (1a) in the drawing of the equivalent circuit shown in FIG. 7. On the other hand, the other end (the drain region 2 of the write transistor) is connected to the write bit line WBL. Also, a gate electrode 5 of the write transistor M2 is connected to a write word line WWL. The portions of the drain region 2 of the write transistor and the gate electrode 5 of the write transistor correspond to portions (2a) and (5a) in the drawing of the equivalent circuit shown in FIG. 7. The charge accumulating unit (the source region 1 of the write transistor) also serves as a gate electrode of the read transistor M1, which changes the current flowing between the source region 7 of the read transistor and the drain region 8 of the read transistor in accordance with the accumulated amount of charge. The source region 7 of the read transistor and the drain region 8 of the read transistor are n type regions with high impurity concentration provided in a p type silicon substrate.

Since the thickness of the channel portion of the write transistor M2 is extremely thin, the leakage current at the time of an OFF state can be extremely reduced in comparison with a normal transistor. The leakage current of the normal transistor at the time of an OFF state is about $10^{-1}$ to $10^{-15}$ A. Meanwhile, in a thin-film transistor having a channel thickness of about 5 nm or smaller as in the present embodiment, the leakage current can be reduced to about $10^{-19}$ A because of a quantum-confinement effect in the thickness direction.

Next, a manufacturing process of a semiconductor memory device according to the fourth embodiment will be described. FIG. 20A and FIG. 20B, FIG. 21A and FIG. 21B, FIG. 22A and FIG. 22B, FIG. 23A and FIG. 23B, and FIG. 24A and FIG. 24B are top views and cross-sectional views for two basic memory cells showing a connection relation with wirings in each step for manufacturing a memory cell array according to the fourth embodiment. In FIG. 20 to FIG. 24, FIG. 20A, FIG. 21A, FIG. 22A, FIG. 23A and FIG. 24A are top views, and FIG. 20B, FIG. 21B, FIG. 22B, FIG. 23B and FIG. 24B are cross-sectional views. FIG. 20B, FIG. 21B, FIG. 22B, FIG. 23B and FIG. 24B correspond to cross-sectional views taken along an A-A' section in each of FIG. 20A, FIG. 21A, FIG. 22A, FIG. 23A and FIG. 24A. Also, each cross-sectional view illustrates the structure above the portion of a semiconductor layer forming an active region of the semiconductor memory device. This semiconductor layer is disposed on a semiconductor substrate or a Silicon on Insulator (SOI) substrate. However, this substrate portion is omitted in each drawing for the purpose of simplification of the drawing.

Figure 21A:
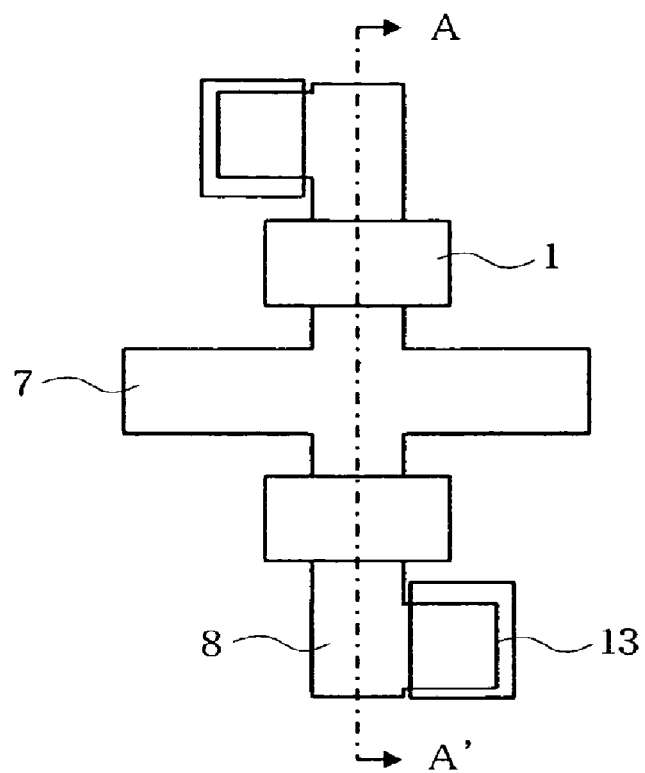
FIG. 21A is a top view for describing the manufacturing process of the semiconductor memory device according to the fourth embodiment of the present invention.

First, through the manufacturing process similar to that in the third embodiment, wells, a device isolation region, a gate insulating film for a peripheral circuit, and a gate insulating film for a logic circuit are sequentially formed in this order. After depositing polysilicon for a gate electrode, impurities are implanted into the polysilicon with using a resist as a mask. Furthermore, a W film and a $SiO_2$ film are deposited and a gate electrode (a source region 1 of the write transistor) is formed with using a resist pattern as a mask as shown in FIG. 21A. At this time, in a repeated pattern in the memory cell, distances between gate electrodes are made approximately equal to one another. By doing so, a super-resolution technology such as a phase shift exposure can be used. Thereafter, when implantation for high-withstand-voltage transistor for a peripheral circuit is performed, impurities are implanted into a contact region with the read bit line to form an n type impurity diffused region with low impurity concentration.

Figure 21B:
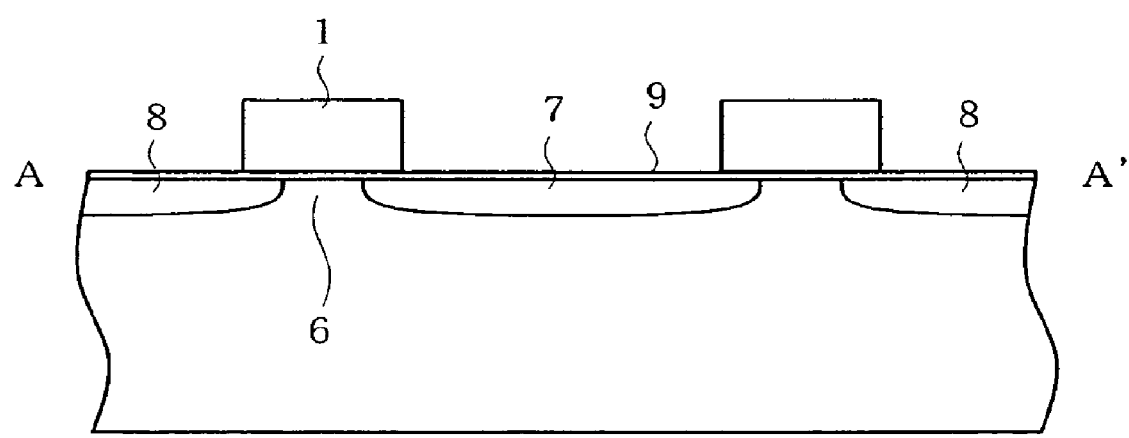
FIG. 21B is a cross-sectional view of the semiconductor memory device taken along an A-A' section in FIG. 21A.

Here, as shown in FIG. 21A and FIG. 21B, a source region 7 of a read transistor and a drain region 8 of the read transistor are formed with using the resist pattern 13 and the gate electrode as masks. At this time, since the contact region (read bit line contact $CT_{RBL}$) connected to the read bit line is covered with the resist pattern 13, the impurity concentration is low. Also, instead of the impurity implantation for a high-withstand-voltage transistor to the contact region, another impurity implantation may be performed to adjust the impurity concentration.

Before and after this impurity implantation described above, a process of diagonally implanting impurities having a polarity different from that of the impurity diffused layer to increase a well concentration of the end portion of the gate electrode can be performed so as to suppress a short channel effect. Here, in order to reduce the resistance of the impurity diffused layer, a silicide process is performed. For example, a titanium silicide or cobalt silicide is formed.

Figure 22A:
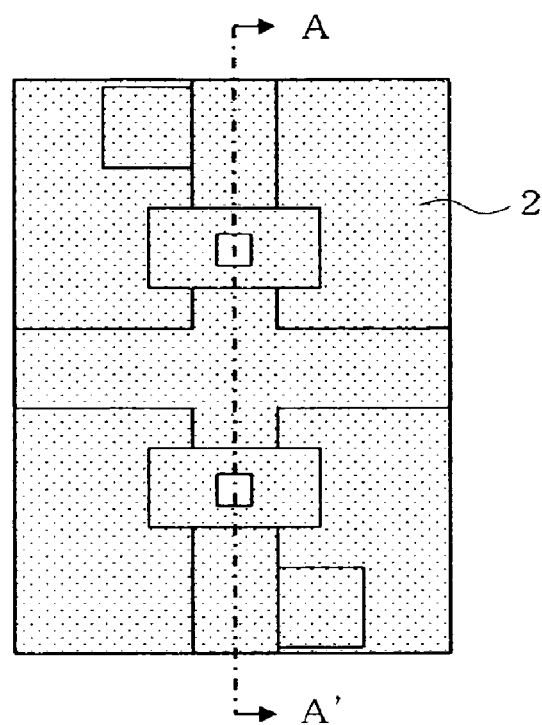
FIG. 22A is a top view for describing the manufacturing process of the semiconductor memory device according to the fourth embodiment of the present invention.
Figure 22B:
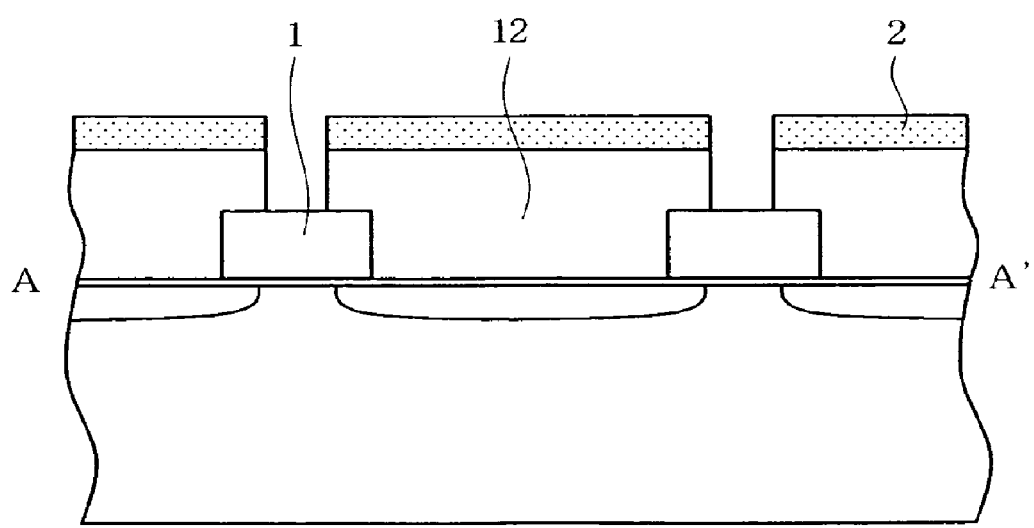
FIG. 22B is a cross-sectional view of the semiconductor memory device taken along an A-A' section in FIG. 22A.

Subsequently, a SiO$_2$ film (interlayer SiO$_2$ 12) is deposited, and further an n type polysilicon film is deposited. Thereafter, as shown in FIG. 22A and FIG. 22B, holes which penetrate through the polysilicon film and the SiO$_2$ film (interlayer SiO$_2$ 12) of the drain region 2 of the write transistor and reach a charge accumulating region (the source region 1 of the write transistor) are formed with using a resist as a mask.

Figure 23A:
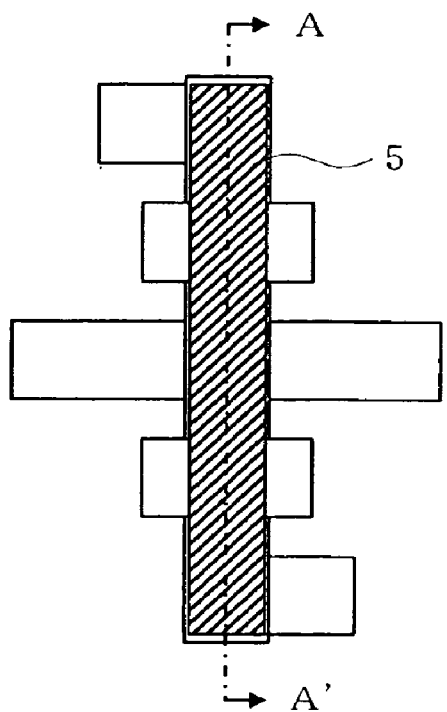
FIG. 23A is a top view for describing the manufacturing process of the semiconductor memory device according to the fourth embodiment of the present invention.
Figure 23B:
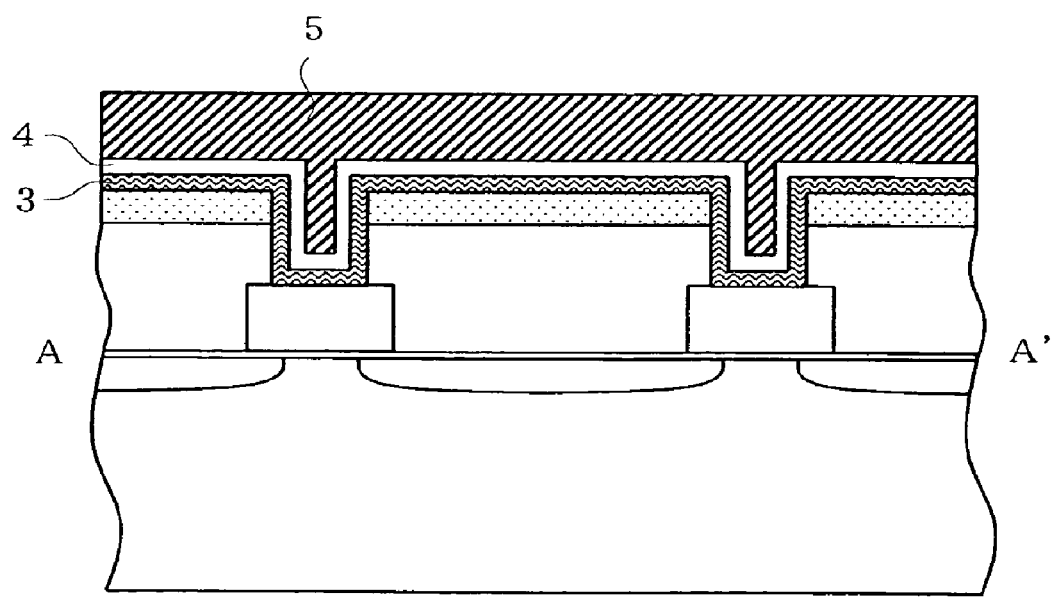
FIG. 23B is a cross-sectional view of the semiconductor memory device taken along an A-A' section in FIG. 23A.

Furthermore, as shown in FIG. 23A and FIG. 23B, amorphous silicon (channel 3) having a thickness of 5 nm or smaller and a SiO$_2$ film having a thickness of 10 nm as the gate insulating film 4 of the write transistor are deposited, and the amorphous silicon is crystallized by the annealing. Then, an n type polysilicon film (gate electrode 5 of the write transistor) is deposited. Thereafter, the polysilicon film (gate electrode 5 of the write transistor), the gate insulating film 4 of the write transistor, and the polysilicon film (drain region 2 of the write transistor) are etched with using a resist as a mask.

Figure 24A:
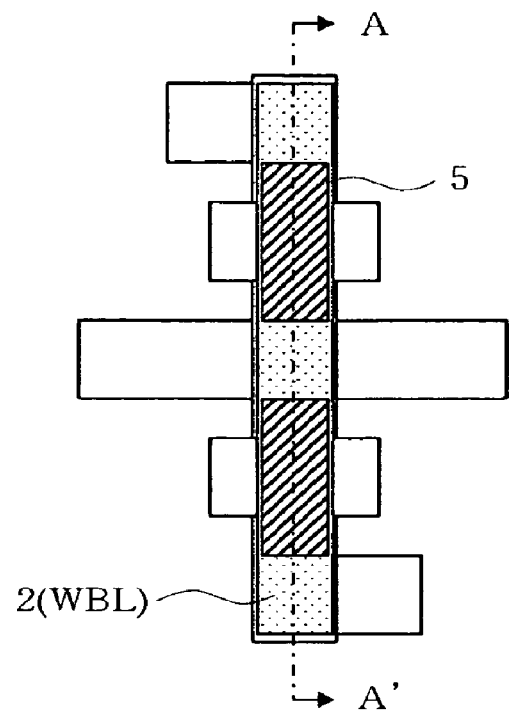
FIG. 24A is a top view for describing the manufacturing process of the semiconductor memory device according to the fourth embodiment of the present invention.
Figure 24B:
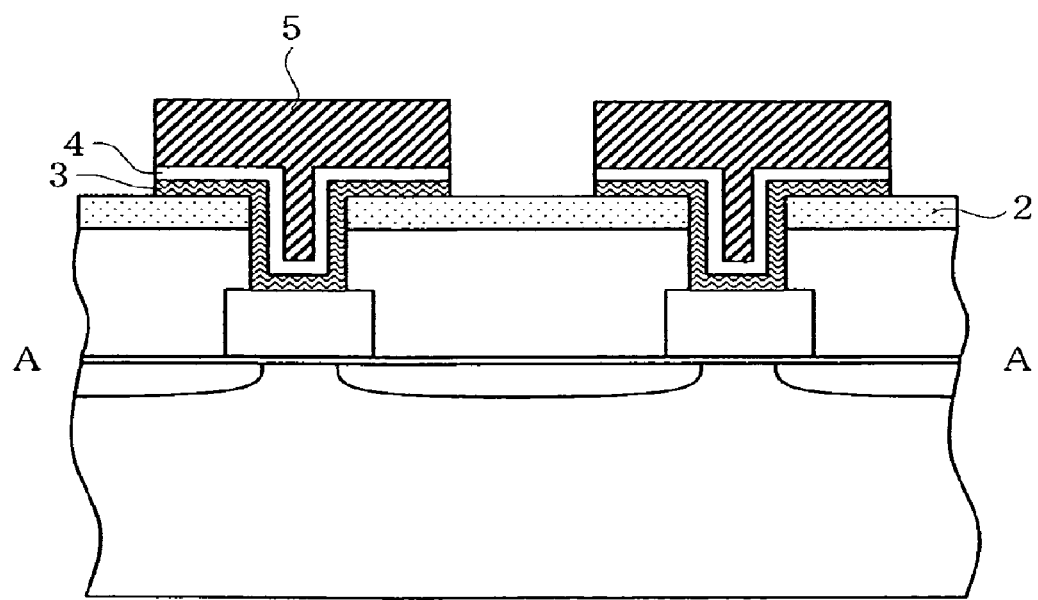
FIG. 24B is a cross-sectional view of the semiconductor memory device taken along an A-A' section in FIG. 24A.

Furthermore, as shown in FIG. 24A and FIG. 24B, the polysilicon film (gate electrode 5 of the write transistor) is etched with using a resist as a mask, thereby forming the gate electrode 5 of the write transistor. Then, after a SiO$_2$ film is deposited and then planarized, a contact process and a wiring process are performed. At this time, the read bit line contact $CT_{RBL}$ on the drain region 8 side of the read transistor has a low impurity concentration, and therefore has a Schottky junction.

Next, the operation in the memory array in the fourth embodiment will be described. Basic read and write operations are similar to those in the third embodiment shown in FIG. 3 and FIG. 4. However, in the fourth embodiment, since the write transistor M2 has an extremely thin channel region, the leakage current can be significantly reduced. For this reason, it is possible to set a longer cycle of refreshing the storage information shown in FIG. 5 and FIG. 6. As a result, the number of times of bit line charge and discharge can be reduced, and thus, it is possible to reduce the power consumption of the memory cell.

The use of the ultra-thin channel thin-film transistor for writing used in the fourth embodiment is not restricted to the memory array structure shown in FIG. 12, but it may be applied to the memory cells in the first and second embodiments.

Fifth Embodiment

Figure 25:
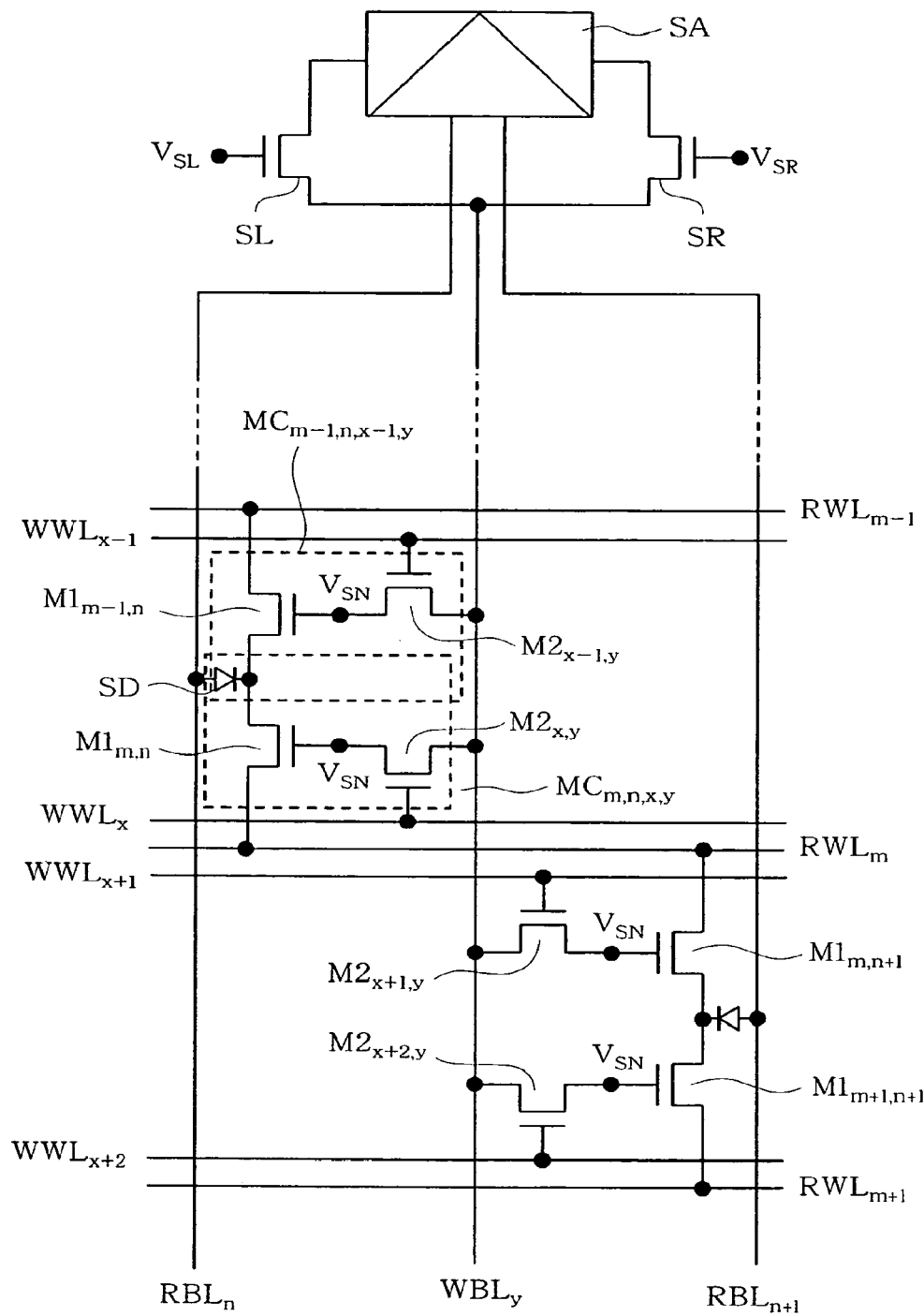
FIG. 25 is a drawing of an equivalent circuit showing a part of the semiconductor memory device according to the fifth embodiment of the present invention.

FIG. 25 is a drawing of an equivalent circuit according to a fifth embodiment of the present invention. In FIG. 25, the memory array structure is similar to that in the third embodiment. However, the way to provide the reference voltage by the sense amplifier SA is different, and the resultant operation is different. The fifth embodiment employs a so-called twin-cell structure, in which memory cells MC connected to the same read word line RWL and write bit line WBL are taken as a basic unit, information to be paired is stored in each of the two cells, and the read bit line of the other cell is used as a reference potential at the time of a read operation.

Figure 26:
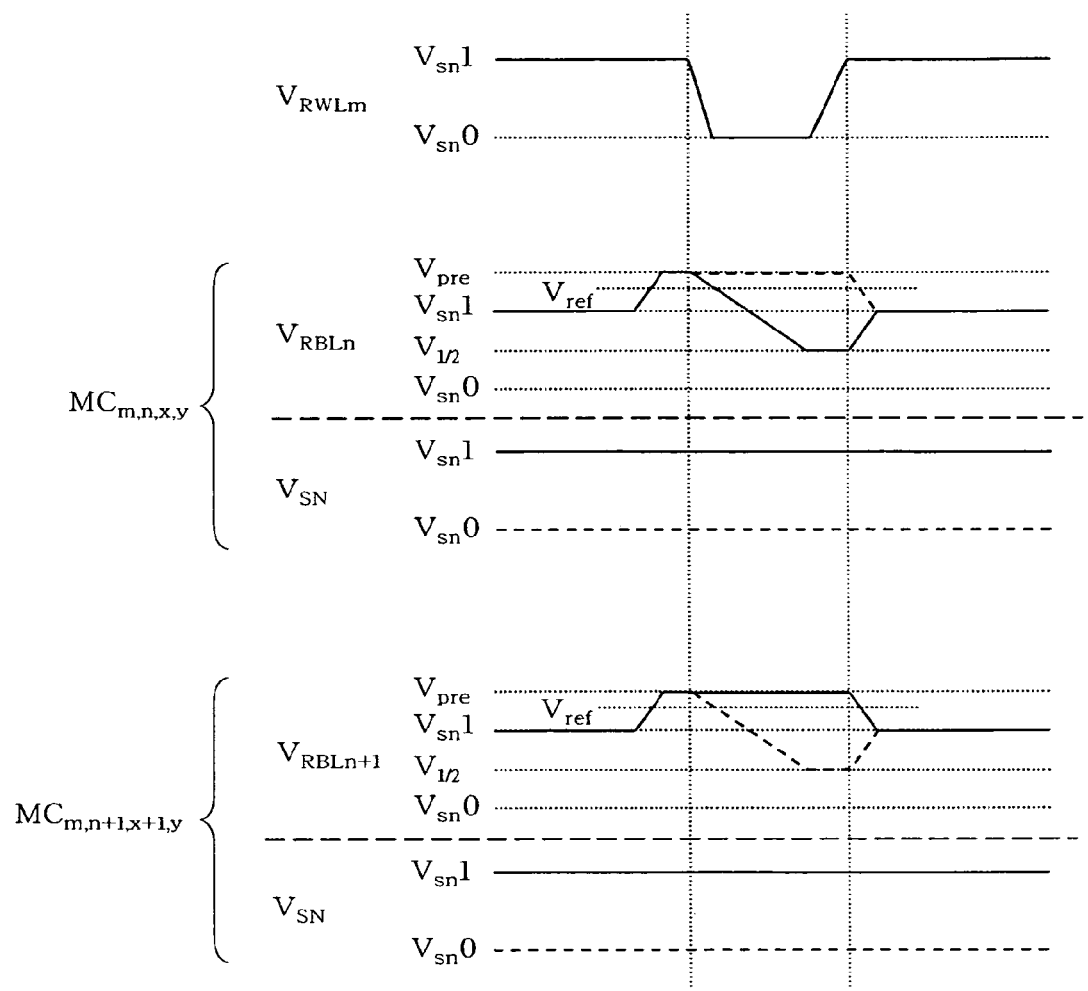
FIG. 26 is a timing chart showing signal waveforms at the time of a read operation of the semiconductor memory elements in the fifth embodiment of the present invention.
Figure 27:
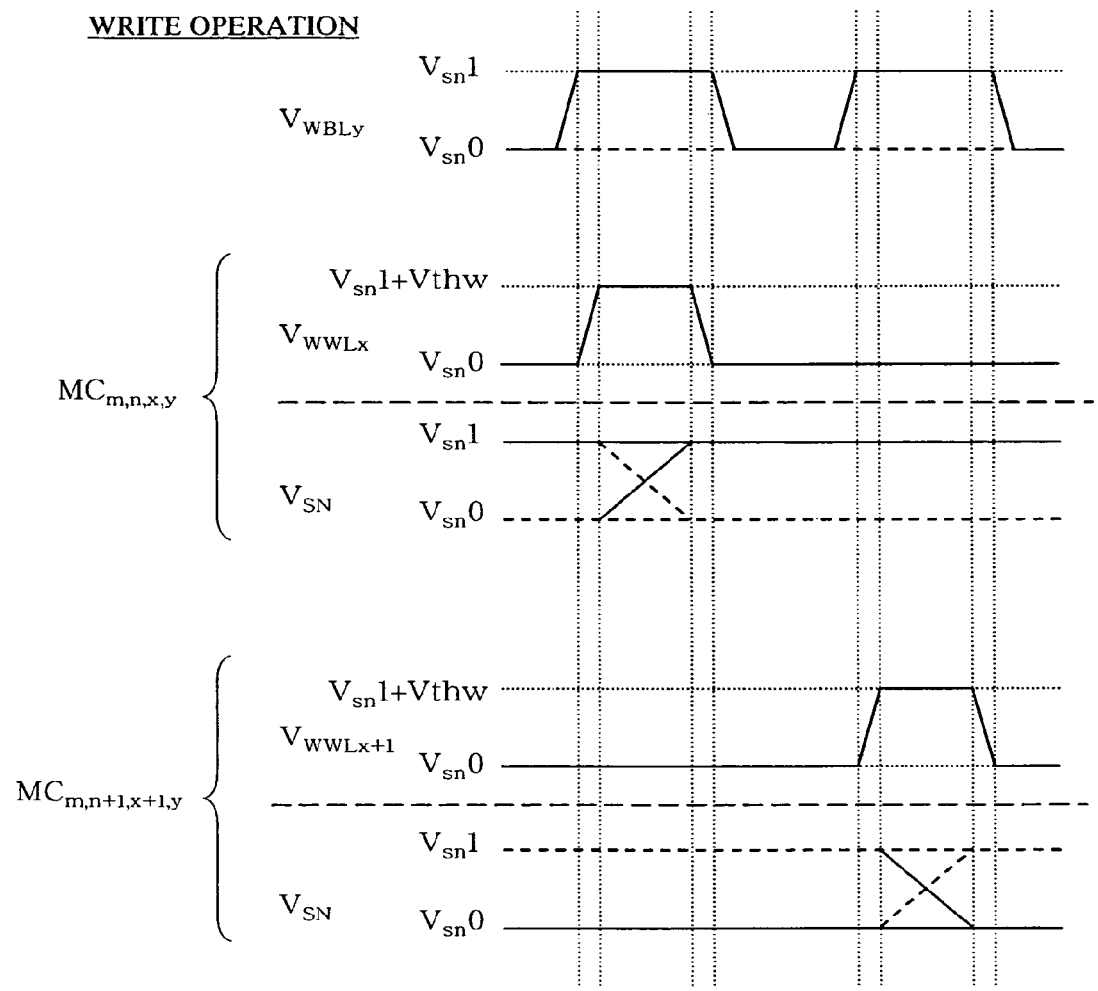
FIG. 27 is a timing chart showing signal waveforms at the time of a write operation of the semiconductor memory elements in the fifth embodiments of the present invention.

In FIG. 26 and FIG. 27, operations when storage information of a memory cell $MC_{m,n,x,y}$ and a memory cell $MC_{m,n+1,x+1,y}$ indicates "1" and "0" are represented by solid lines, and operations when it indicates "0" and "1" are represented by broken lines.

Figure 28:
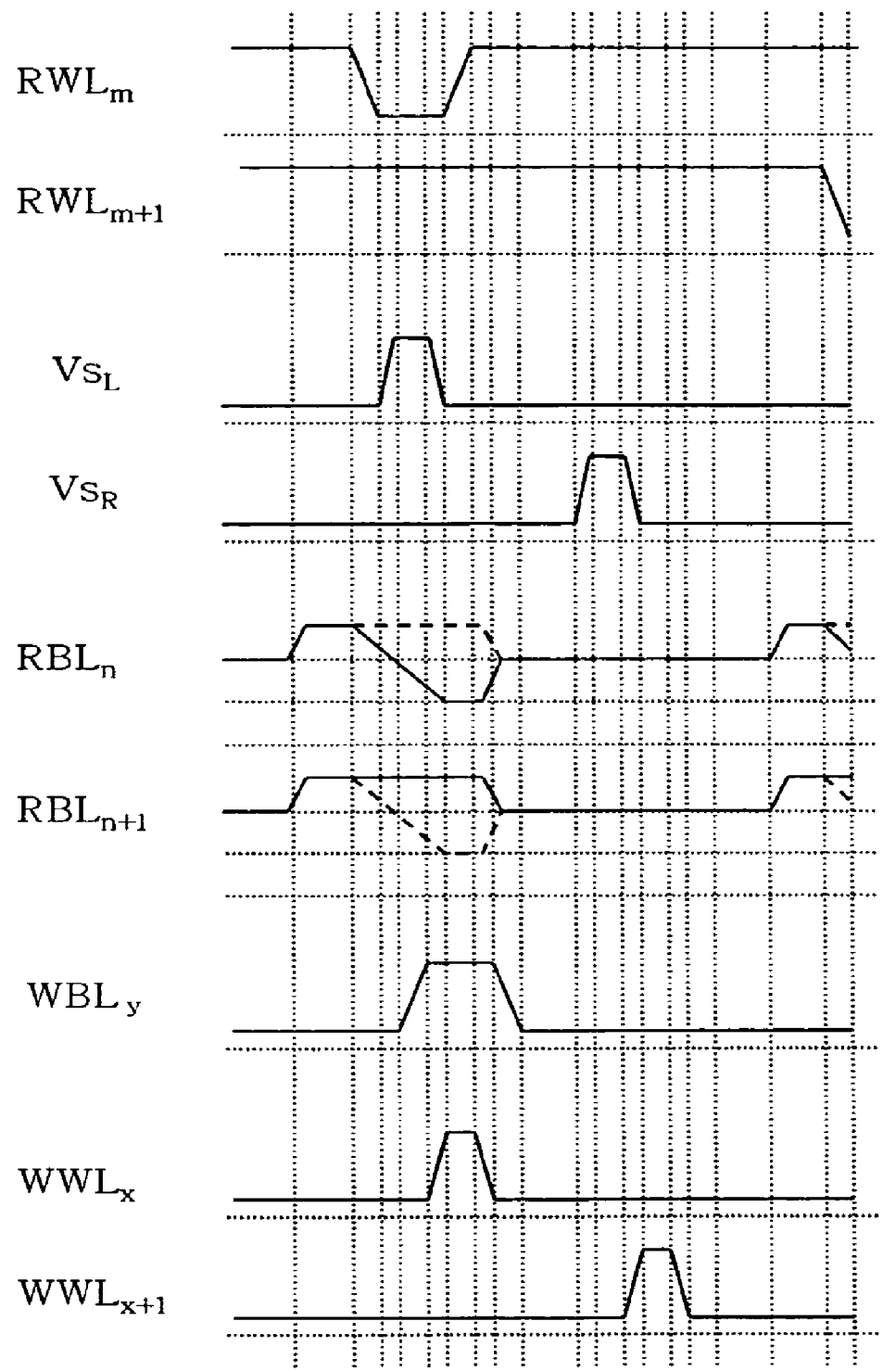
FIG. 28 is a timing chart showing signal waveforms at the time of a refresh operation of the semiconductor memory device according to the fifth embodiment of the present invention.
Figure 29A:
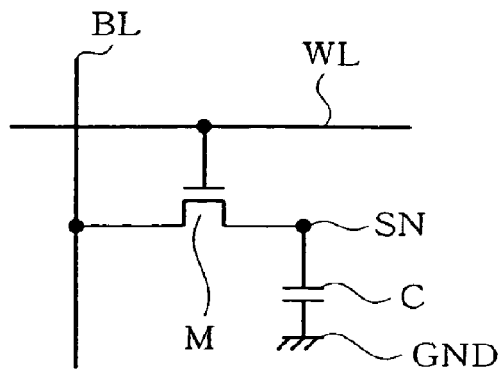
FIG. 29A is a drawing of an equivalent circuit showing a DRAM memory cell studied as a premise of the present invention.
Figure 29B:
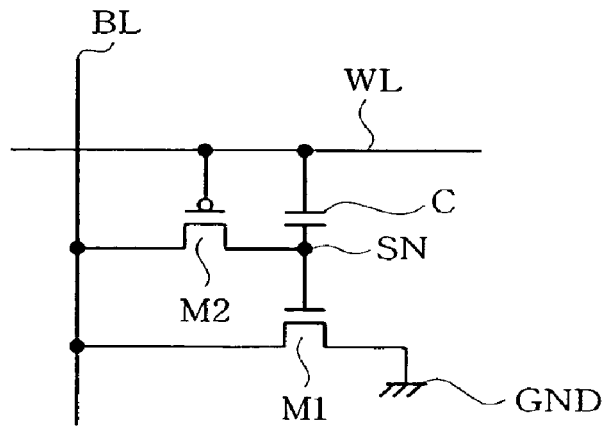
FIG. 29B is a drawing of an equivalent circuit showing a DRAM memory cell studied as a premise of the present invention.
Figure 29C:
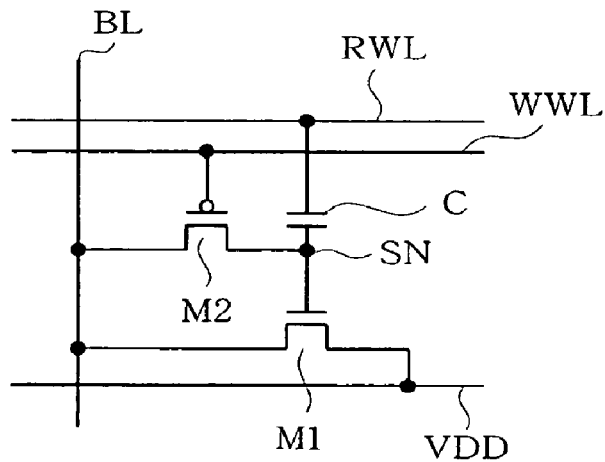
FIG. 29C is a drawing of an equivalent circuit showing a DRAM memory cell studied as a premise of the present invention.

Also, FIG. 28 depicts a refresh operation of the memory cell $MC_{m,n,x,y}$ and the memory cell $MC_{m,n+1,x+1,y}$.

Since one information is stored in two memory cells, the memory cell area is doubled. However, a sufficiently large potential difference with respect to the reference potential at the sense amplifier can be taken and a reading malfunction can be suppressed. Therefore, this is suitable for a low-voltage operation of the memory cell.

Note that the twin-cell structure according to the fifth embodiment is applied to the memory array structure according to the third embodiment. Alternatively, the twin-cell structure may be applied to the memory array structures according to the first and second embodiments.

Therefore, according to the memory (semiconductor memory device) having a two-transistor gain cell structure in the first to fifth embodiments, stable reading can be achieved without malfunction, and design flexibility of the threshold voltage of the transistor can be increased. Also, since a memory cell is connected to the same read word line and write bit line as those of an adjacent memory cell, it is possible to suppress an increase in the memory cell array area due to an increase in the number of wirings.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be applied to semiconductor memory devices such as DRAM.

What is claimed is:

1. A semiconductor memory device comprising:
   a plurality of memory cells each including a first transistor and a second transistor, a gate electrode of the first transistor being connected to a source electrode of the second transistor,
   wherein two memory cells of the plurality, which are arranged adjacent to each other, have a line-symmetric shape with respect to a boundary of the two memory cells,
   wherein the second transistor is a thin film transistor,
   wherein a source region, a drain region, and a channel region of the first transistor are formed in a semiconductor substrate, and
   wherein a source region, a drain region, and a channel region of the second transistor are formed over the semiconductor substrate, through an insulating film.

2. A semiconductor memory device according to claim 1, wherein the source region of the second transistor is a gate electrode of the first transistor.

3. A semiconductor memory device comprising:
   a plurality of memory cells each including a first transistor and a second transistor, a gate electrode of the first transistor being connected to a source electrode of the second transistor, wherein two memory cells of the plurality, which are arranged adjacent to each other, have a line-symmetric shape with respect to a boundary of the two memory cells, wherein drain regions of second transistors of two of the memory cells, which are adjacently arranged in a first direction, are connected to each other, and wherein drain regions of two of the second transistors of two of the memory cells, which are adjacently arranged in a second direction perpendicular to the first direction, are separated from each other.

4. A semiconductor memory device comprising:

a plurality of memory cells each including a first transistor and a second transistor, a gate electrode of the first transistor being connected to a source electrode of the second transistor, wherein two memory cells of the plurality, which are arranged adjacent to each other, have a line-symmetric shape with respect to a boundary of the two memory cells, and wherein second transistors of two of the memory cells, which are adjacently arranged in a second direction, are formed between first transistors of the two memory cells.

5. A semiconductor memory device according to claim 4, wherein the first transistors of the memory cells are arranged in a row in a first direction perpendicular to the second direction, and wherein the second transistors of the memory cells are arranged in a row in the first direction.

6. A semiconductor memory device according to claim 1, wherein a thickness of the channel region of the second transistor is no more than 5 nm.

* * * * *